United States Patent
Liu et al.

(10) Patent No.: US 6,735,537 B2
(45) Date of Patent: May 11, 2004

(54) PROCEDURE FOR MEASURING THE CURRENT IN EACH PHASE OF A THREE-PHASE DEVICE VIA SINGLE CURRENT SENSOR

(75) Inventors: Guang Liu, Lake Zurich, IL (US); Alexander Kurnia, Buffalo Grove, IL (US); Ronan De'Larminat, Northbrook, IL (US)

(73) Assignee: Motorola, Inc., Schaumburg, IL (US)

(*) Notice: Subject to any disclaimer, the term of this patent is extended or adjusted under 35 U.S.C. 154(b) by 99 days.

(21) Appl. No.: 10/099,814

(22) Filed: Mar. 15, 2002

(65) Prior Publication Data

US 2003/0173946 A1 Sep. 18, 2003

(51) Int. Cl.[7] ............................................... G01R 19/00
(52) U.S. Cl. ................... 702/64; 318/810; 318/811; 318/606; 318/599; 324/772; 324/142
(58) Field of Search ..................... 702/64; 318/71, 318/810, 811, 606, 599; 324/107, 772, 142

(56) References Cited

U.S. PATENT DOCUMENTS

| | | |
|---|---|---|
| 5,274,317 A | 12/1993 | Utley et al. |
| 5,309,349 A * | 5/1994 | Kwan .................. 363/98 |
| 5,436,545 A | 7/1995 | Bahr et al. |

(List continued on next page.)

FOREIGN PATENT DOCUMENTS

| | | |
|---|---|---|
| EP | 0 502 226 A1 | 3/1991 |
| EP | 0599260 A1 | 6/1994 |
| EP | 0 502 226 B1 | 9/1995 |
| EP | 1 083 650 A2 | 3/2001 |
| WO | WO 01/20343 A1 | 3/2001 |

OTHER PUBLICATIONS

"Pulse Width Modulation" AXIOMATIC Technologies Corporation, pp 1–3 (Jul. 10, 2000).
"Field Orientated Control of 3–Phase AC–Motors". Texas Instruments Europe, Feb. 1998.
Buyukbozkirli et al. "An Alternative Pulse–Width Modulation Scheme for Automotive Inverters". McCleer Power, Inc. May 2001.

(List continued on next page.)

*Primary Examiner*—John Barlow
*Assistant Examiner*—Anthony T Dougherty
(74) *Attorney, Agent, or Firm*—Thomas V. Miller

(57) ABSTRACT

A method for measuring the current in each phase of a three-phase motor (26) by the sensor (32), the motor (26) being controlled by a plurality of switching devices (S1–S6) that receive pulse width modulation signals from a controller (34). In one embodiment, a first and second sampling window (t1 and t2) are monitored. When both the first and second sampling windows (t1 and t2) are less than a minimum sampling window (mw), the voltage pulse trains associated with the highest output (V_h) and the lowest output (V_l) are shifted to form a first modified sampling window (t1') and a modified second sampling window (t2'). When the first sampling window (t1) is less than the minimum sampling window and the second sampling window (t2) is greater than the minimum sampling window (mw), then the voltage pulse train associated with the highest output (V_h) and/or the middle output (V_m) may be shifted to form the first and second modified sampling windows (t1' and t2'). When the first sampling window (t1) is greater than the minimum sampling window (mw) and the second sampling window (t2) is less than the minimum sampling window (mw), then the voltage pulse train associated with the lowest output (V_l) and/or the middle output (V_m) is shifted to form the first and second modified sampling windows (t1' and t2'). The method may then sample a first current and a second current during the first and second modified sampling windows (t1' and t2'), respectively. The third current may be calculated based on the sampling of the first and second currents.

60 Claims, 17 Drawing Sheets

U.S. PATENT DOCUMENTS

| | | | |
|---|---|---|---|
| 5,874,818 A | * 2/1999 | Schuurman | 318/439 |
| 5,955,862 A | 9/1999 | Nguyen Phuoc | |
| 5,969,958 A | * 10/1999 | Nielsen et al. | 363/41 |
| 6,023,136 A | * 2/2000 | Pinewski | 318/254 |
| 6,049,474 A | 4/2000 | Platnic | |
| 6,075,338 A | 6/2000 | Mazza et al. | |
| 6,185,115 B1 | * 2/2001 | Sul et al. | 363/37 |
| 6,316,895 B1 | 11/2001 | Ramarathnam | |
| 6,529,393 B1 | * 3/2003 | Yu | 363/41 |

OTHER PUBLICATIONS

Yu et al. "AC Induction Motor Control Using Constant V/Hz Principle and Space Vector PWM Technique with TMS320C240". Texas Instruments Incorporated, Apr. 1998.

Blaabjerg et al. "An Ideal PWM–VSI Inverter Using Only One Current Sensor in the DC–Link". Aalborg University, Denmark. *Power Electronics and variable–Speed Drives,* 26– Oct. 28, 1994, Conference Publication No. 399; IEEE 1994, pp. 458–464.

Ledwich, G. "Pulse Width Modulation (PWM) Basics" 1998.

Anderson, Peter H. "Pulse Width Modulation". Morgan State University, Baltimore, MD; Aug. 9, 1997.

Barr, Michael "Pulse Width Modulation". *Embedded Systems Programming,* CMP Media, Inc.; Sep. 2001, pp 103–104.

* cited by examiner

| S1, S2 | S3, S4 | S5, S6 | i_dc_link | Vector |
|---|---|---|---|---|
| S1=closed S2=open | S3=open S4=closed | S5=open S6=closed | i_a | V1 |
| S1=closed S2=open | S3=closed S4=open | S5=open S6=closed | -i_c | V2 |
| S1=open S2=closed | S3=closed S4=open | S5=open S6=closed | i_b | V3 |
| S1=open S2=closed | S3=closed S4=open | S5=closed S6=open | -i_a | V4 |
| S1=open S2=closed | S3=open S4=closed | S5=closed S6=open | i_c | V5 |
| S1=closed S2=open | S3=open S4=closed | S5=closed S6=open | -i_b | V6 |
| S1=closed S2=open | S3=closed S4=open | S5=closed S6=open | i_0 offset | V0 |
| S1=open S2=closed | S3=open S4=closed | S5=open S6=closed | i_0 offset | V7 |

FIG. 3

| Sector $V_{\alpha\beta}$ | Switching States $(S_a, S_b, S_c)$ | $i\_a$ | $i\_b$ | $i\_c$ |
|---|---|---|---|---|
| I | (1, 0, 0)<br>(1, 1, 0) | $i\_h$ | $-(i\_h + i\_l)$ | $i\_l$ |
| II | (1, 1, 0)<br>(0, 1, 0) | $-(i\_h + i\_l)$ | $i\_h$ | $i\_l$ |
| III | (0, 1, 0)<br>(0, 1, 1) | $-i\_l$ | $i\_h$ | $-(i\_h + i\_l)$ |
| IV | (0, 1, 1)<br>(0, 0, 1) | $-(i\_h + i\_l)$ | $-(i\_h + i\_l)$ | $i\_h$ |
| V | (0, 0, 1)<br>(1, 0, 1) | $i\_h$ | $-i\_l$ | $i\_h$ |
| VI | (1, 0, 1)<br>(1, 0, 0) | $i\_h$ | $-i\_l$ | $-(i\_h + i\_l)$ |

FIG. 11

PROCEDURE FOR MEASURING THE CURRENT IN EACH PHASE OF A THREE-PHASE DEVICE VIA SINGLE CURRENT SENSOR

FIELD OF THE INVENTION

This invention in general relates to three-phase power devices (such as three-phase motors) and, more particularly, to an improved procedure for measuring the currents in each phase via a single current sensor.

BACKGROUND OF THE INVENTION

A three-phase motor (such as a permanent magnet synchronous motor and induction motor) is used in automotive applications such as power steering systems. It is known to control the phase windings in a three-phase motor using pulse width modulated signals. The pulse width modulated signals are applied to an inverter or a series of switching devices that connect the phase windings of the motor to either a positive or negative terminal of the vehicle battery.

To adequately control the motor, it is necessary to measure the current flowing through each phase winding. The current measured in each phase is provided to a controller that generates the pulse width modulated signals. To measure currents, it is known to use a resistor in series with each phase winding. The voltage drop across each resistor is measured to determine the current flowing for each phase. This type of system has the disadvantage of requiring three current sensors, one for each of the three phase windings.

It is also known to reduce at least one of the current sensors and calculate the current through the phase without a sensor based on the measurements of the other two phases. Since the sum of all currents flowing through all phases of the motor must be zero, knowing the current flowing through two phases allows a determination of the current flowing through the phase without a sensor.

It has also been proposed to use a single resistor to perform the function of measuring the current through each phase of the three-phase motor. The single resistor is located on the DC link between the DC power supply and the inverter or series of switching devices. Depending on the states of the switches and period of operation, the currents through the phases may be measured or calculated.

A system using a single DC link current sensor is described in European Patent Application EP 1 083 640 A2. There, the system proposes to shift certain pulse width modulated signals for measuring currents during certain times.

Recent advances in digital signal processors (DSPs) have permitted the use of more advanced pulse width modulation schemes such as space vector pulse width modulation (hereinafter "SVPWM"). One significant advantage of using SVPWM is that it can provide 15% more output voltage compared to conventionally known sinusoidal pulse width modulation schemes. The drawback, however, is that SVPWM requires more complex schemes to measure full phase currents via a single DC link current sensor. For instance, there are situations where the full phase currents cannot be sampled during SVPWM operation. One situation is when the amplitude of the voltage space vector is very small. Another situation is when the voltage space vector falls on one of the active vectors. During these situations, the system may be unable to reliably measure or calculate the current through all three phases of the windings in the motor.

Further improvements are needed to known systems to fully utilize SVPWM in three-phase motor applications. In particular, a need exists for improved procedures and schemes to shift pulse width modulated signals to account for a variety of cases where the reliability of the measurement may be in question. Moreover, a continuing need exists for improving the accuracy of the current measurements for each phase. It is, therefore, desirable to provide an improved procedure for reliably and more accurately measure the currents flowing in each phase of a three-phase device to overcome most, if not all, of the preceding problems.

BRIEF DESCRIPTION OF THE DRAWINGS

FIG. 3 is a table reflecting the eight possible switching states for vectors V0–V7;

FIG. 11 is a table that may be used for converting the phase currents to currents associated with specific phase windings of a motor;

Figure 1:
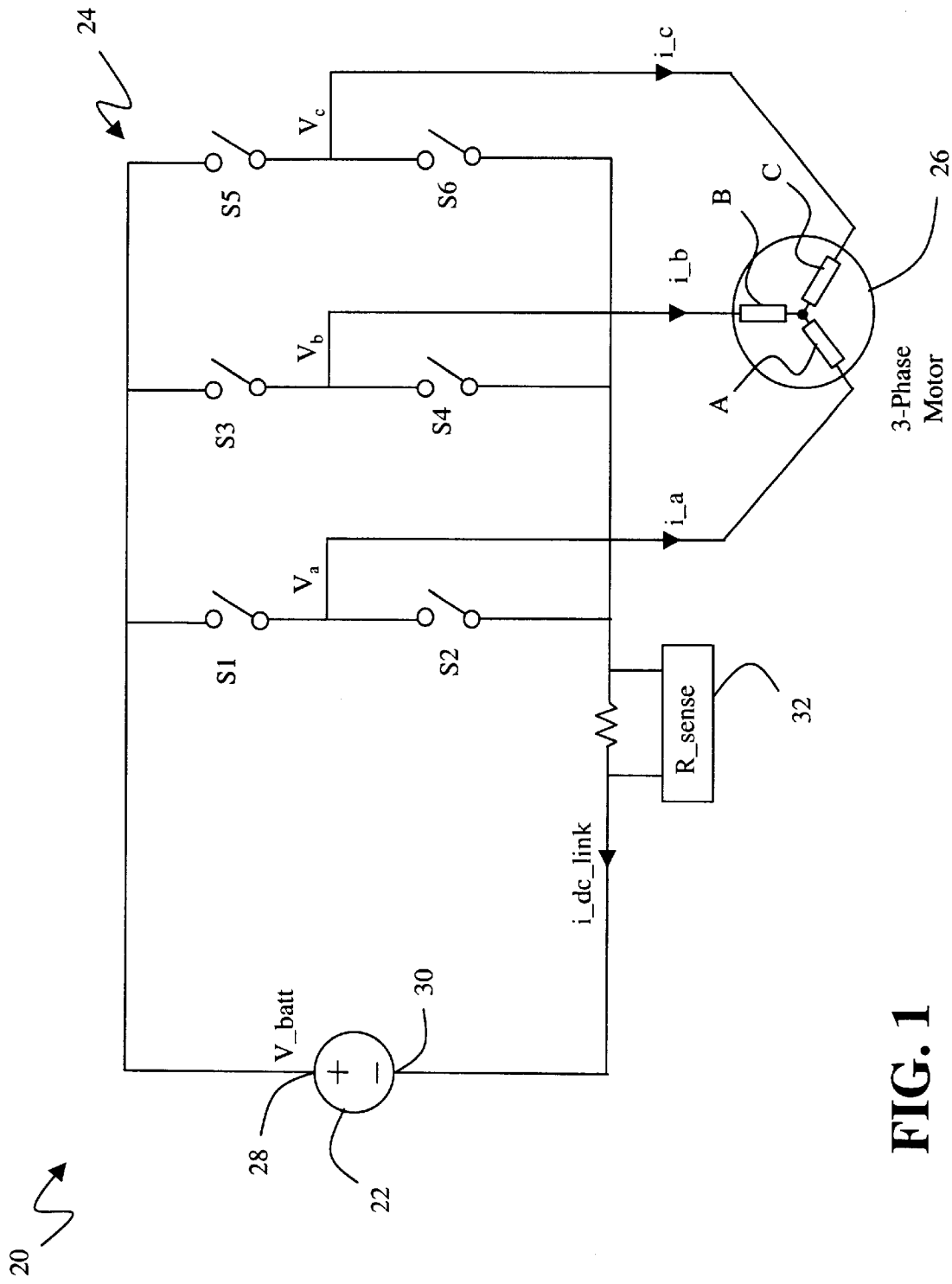
FIG. 1 is a diagram of a system that could utilize the embodiments of the present invention, the system having a power source, an inverter or switching circuit, and a three-phase motor.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is an improved procedure for measuring the electric current flowing through each phase of a three-phase device in a system using SVPWM. For purposes of illustration and description, an example of an application of the procedure for a three-phase motor for automotive uses will be used. Three-phase motors, such as permanent magnet synchronous motors, may be used as part of a power steering system in an automobile. The present invention, however, is not limited to three-phase motors for automobiles and may be applicable to other three-phase devices that use SVPWM.

Now, turning to the drawings, an example use of a system for a three-phase motor in an automotive application will be explained. Referring to FIG. 1, there is a system 20 having generally a power source 22, an inverter or switching circuit 24, and a motor 26. For automotive use, the power source 22 may be an automobile DC battery having a positive terminal 28 and a negative terminal 30. The negative terminal 30 may also be a ground connection. The motor 26 may be a motor having three phase windings A, B, C in a star connection, although other connection types may be used such as a delta connected motor. Such motors may include, for example, a permanent magnet synchronous motor or an induction motor.

The inverter or switching circuit 24 includes three sets of switching devices, one set for each phase winding of the motor 26. A first set of switching devices S1, S2 are capable of providing a first voltage $V_a$ to the first phase winding A. A second set of switching devices S3, S4 are capable of providing a second voltage $V_b$ to the second phase winding B. A third set of switching devices S5, S6 are capable of providing a third voltage $V_c$ to the third phase winding C.

In one embodiment, each set of switching devices has an upper switching device S1, S3, S5 connected to the positive terminal 28 of the power source 22 and a lower switching device S2, S4, S6 connected to the negative terminal 30 of the power source 22 (or ground). Each switching device within a set is complimentary to the other switch within the same set. For example, when the upper switching device S1 of the first set of switching devices S1, S2 is closed, the corresponding lower switching device S2 within the first set of switching devices S1, S2 is open. Similarly, when the upper switching device S1 of the first set of switching devices S1, S2 is open, the corresponding lower switching device S2 within the first set of switching devices S1, S2 is closed.

By having complementary switching devices, the opening and closing of switching devices within each set allows each phase winding A, B, C of the motor 26 to be connected to a positive terminal 28 or a negative terminal 30 of the power supply 22. This permits a voltage $V_a$, $V_b$, or $V_c$ to be applied to a corresponding phase winding A, B, or C of the motor 26, respectively. The current flowing through each phase winding A, B, or C is represented in FIG. 1 by a corresponding variable i_a, i_b, or i_c, respectively.

Figure 2:
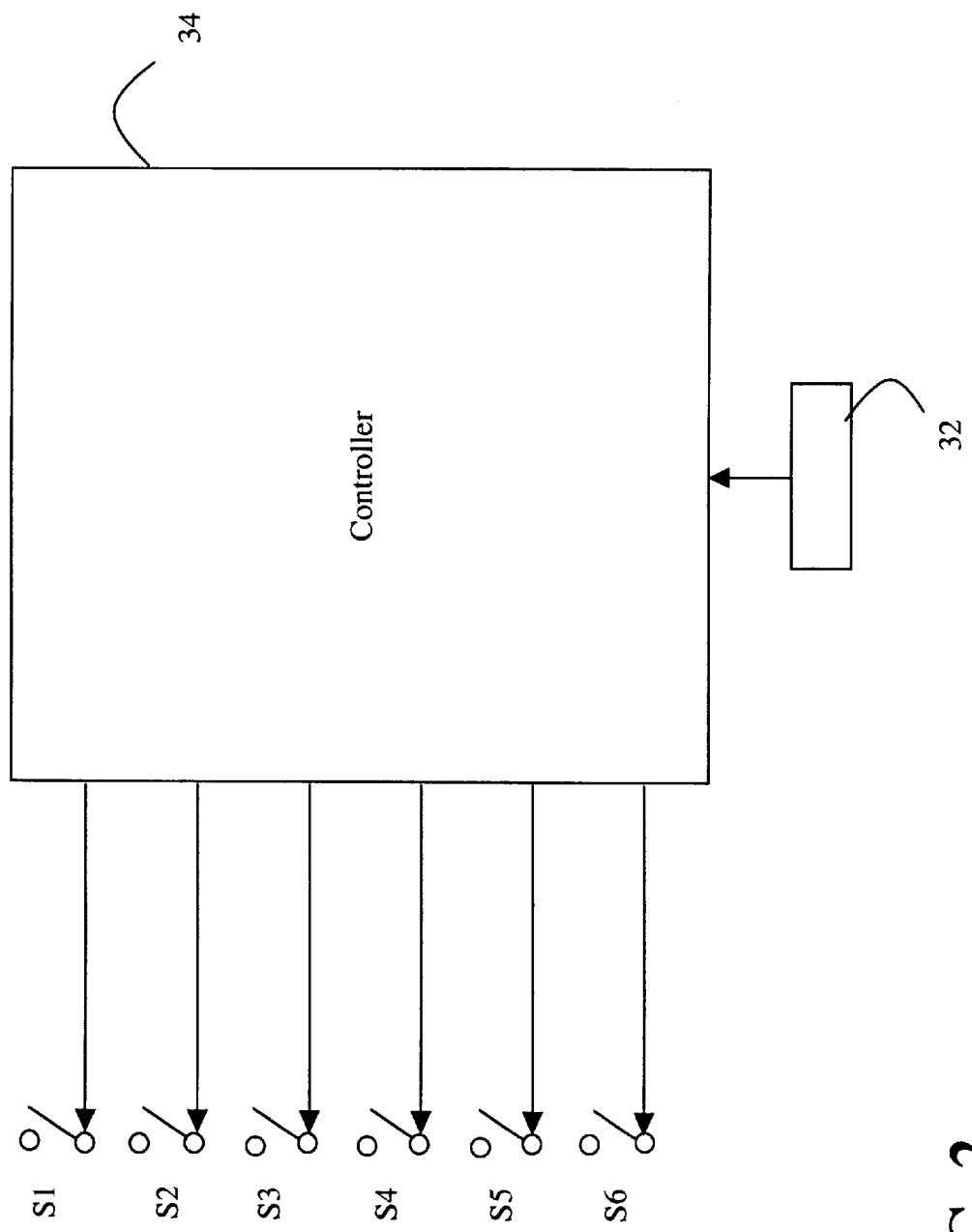
FIG. 2 is a diagram of a controller for the system in FIG. 1 for generating SVPWM signals to a plurality of switching devices.

As will be explained in more detail below, the present invention uses SVPWM signals to control the switching devices S1–S6. Referring to FIG. 2, a controller 34 is used to generate a SVPWM signal to each of the switching devices S1–S6. The controller 34 generates the SVPWM signal based on the current measurements provided by a current sensor 32. The controller 34 may include a digital processor and memory to store software having control algorithms. The digital processor supplies the SVPWM signals based the control algorithms implemented in software. A suitable controller 34 having a digital processor for the present invention may be obtained from Texas Instruments Incorporated as part number TMSTMS320LF2406. The part is a digital signal processor (DSP) controller that includes flash memory to store software. Alternatively, the controller 34 could include a DSP processor with an external memory (not shown).

A variety of switching devices S1–S6 may be used for the switching circuit 24. For example, the switching devices S1–S6 may be power transistors such as IGBT, power MOSFET, and bipolar. The SVPWM signals would then be applied to the gates or bases of the power transistors. What is important is that each switching device S1–S6 is capable of being opened or closed (or turned off or on) by applying a SVPWM signal.

Referring back to FIG. 1, to adequately control the motor 26, the currents for variables i_a, i_b, i_c need to be measured or otherwise known. In one embodiment, the single current sensing device 32 is positioned on the DC link between the power supply 22 and the switching circuit 24. In particular, the current sensing device 32 is located between the lower switching devices S2, S4, S6 of the switching circuit 24 and the negative terminal 30 (or ground) of the power supply 22. The current sensing device 32 may be a sensor that measures the voltage drop across a resistor. The current sensing device 32 may be capable of converting the measured voltage drop to a current (represented by i_dc_link) through the DC link according to well-known methods. Alternatively, the measured voltage drop from sensor 32 may be provided to the controller 34 and the controller 34 may convert the sensed voltage drop to a current.

As explained above, each switching device within a set of switching devices is complementary to the other switching device. For a three-phase motor system, this results in eight possible switching states. The table illustrated in FIG. 3 reflects the eight possible switching states as vectors V0–V7. The first column 40 in the table represents the states (open/closed) of the first set of switching devices S1, S2. The second column 42 in the table represents the states (open/closed) of the second set of switching devices S3, S4. The third column 44 in the table represents the states (open/closed) of the third set of switching devices S5, S6. The fourth column 46 reflects the relationship between the current through the DC link (i_dc_link) and the currents i_a, i_b, and i_c through the various phase windings A, B, and C. The fifth column 48 reflects the eight vector states. Out of the eight possible switching states, there are six active vector states (V1–V6) where current will flow through the DC link and two zero vector states (V0, V7) where no current will flow through the DC link.

The present invention uses SVPWM signals to control the states of the switching devices S1–S6. By controlling the states of the switching devices S1–S6, desired phase voltages may be applied to the phase windings A, B, C of the motor 26.

Figure 4:
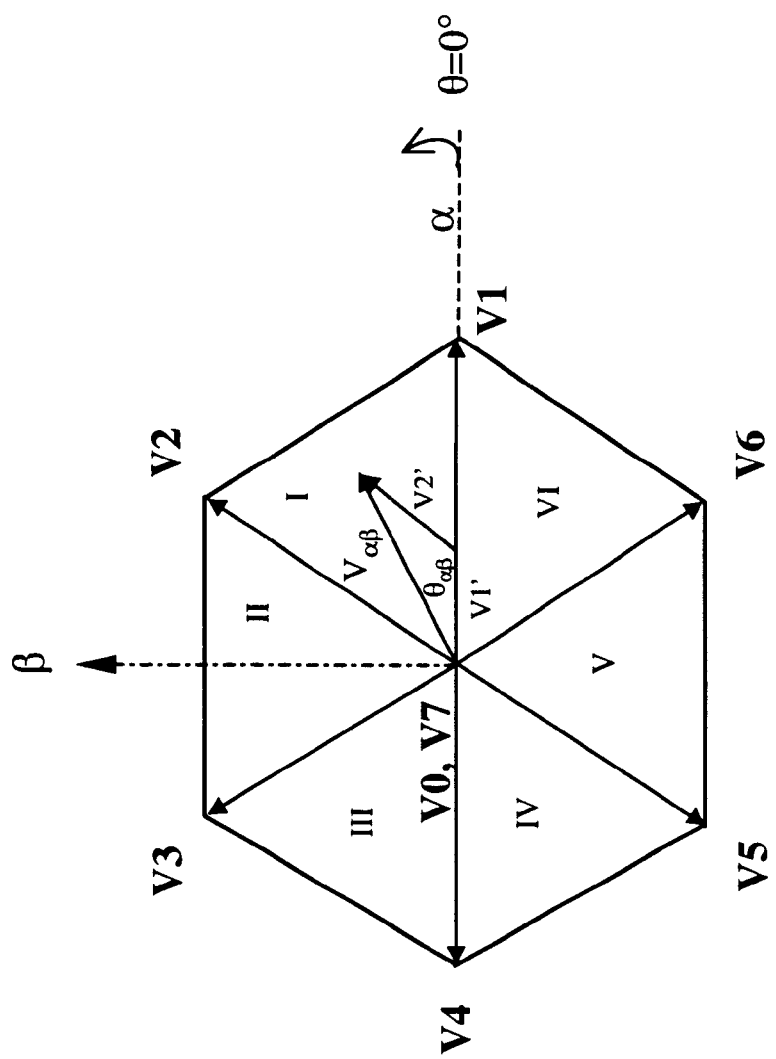
FIG. 4 is an inverter voltage space vector diagram for SVPWM operation.

FIG. 4 shows a typical inverter voltage space vector diagram for SVPWM operation. The vector diagram is divided into six sectors I–VI. When the inverter or switching circuit 24 is driving the motor 26, the voltage space vector $V_{\alpha\beta}$ will rotate at the same speed as the motor 26.

A voltage space vector will fall within one of the sectors I–VI or fall on one of the active vectors V1–V6. If the voltage space vector falls within a sector, two adjacent vectors are chosen. For example, FIG. 4 illustrates a voltage space vector $V_{\alpha\beta}$ falling within sector I. The voltage space vector $V_{\alpha\beta}$ can be represented by two adjacent vectors V1' and V2' in the following relations:

$$V_{\alpha\beta}=V1'+V2' \quad (1)$$

$$V1'=V1*(t1/tp) \quad (2)$$

$$V2'=V2*(t2/tp) \quad (3)$$

$$tp=Tp/2 \quad (4)$$

In the above relations, t1 is a first time period during which vector V1 is applied; t2 is a second time period during which vector V2 is applied; Tp is a full pulse width modulated cycle or period; tp is half of a full pulse width modulated cycle or period.

The amplitude of the voltage space vector $V_{\alpha\beta}$ can be described by a modulation index. When the output voltage changes from 0 to a maximum value, the modulation index varies from 0 to 1.15.

Figure 5:
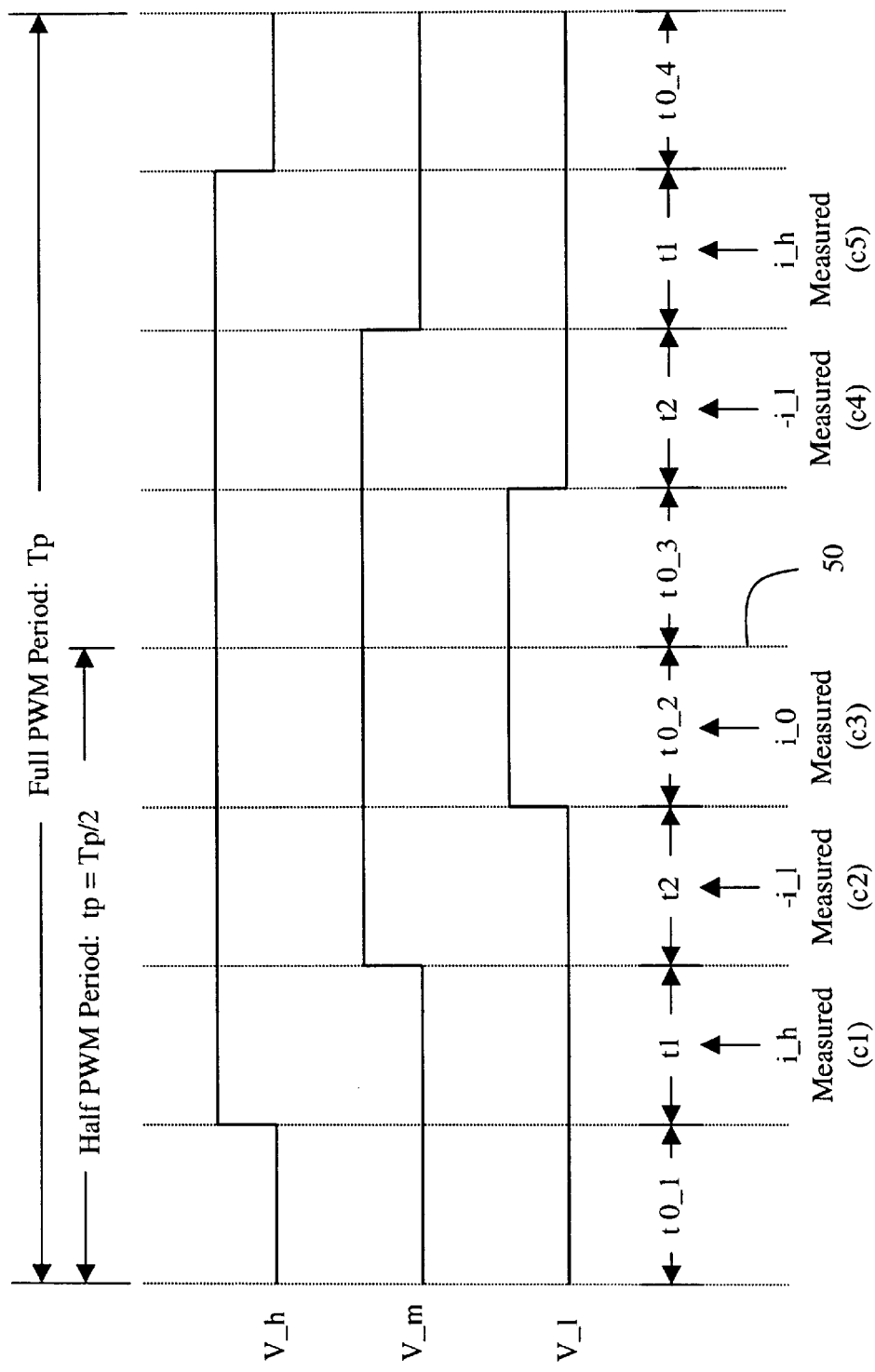
FIG. 5 is a timing diagram for naturally symmetric SVPWM signals showing locations of current measurements according to one embodiment of the present invention.

Referring to FIG. 5, a timing diagram is shown for naturally symmetric SVPWM signals. The timing diagram in FIG. 5 shows the voltage pulse trains applied to the upper switching devices S1, S3, S5 that correspond to the three phases of the motor 26 over a single pulse width modulation cycle or period Tp. A half cycle or period is shown in FIG. 5 as tp, where tp=Tp/2. Although not shown in FIG. 5, it should be recognized that for each voltage pulse train in FIG. 5, there is a corresponding opposite voltage pulse train for the lower switching devices S2, S4, S6.

In pulse width modulation schemes, the pulse width modulated signal is not constant. Rather, the signal is on for a part of the period and off for another part of the period. In FIG. 5, the high state of the voltage pulse train indicates that an upper switching device S1, 53, 55 is closed (and a corresponding lower switching device S2, S4, 56 is open by a corresponding opposite voltage pulse train (not shown)).

The low state of the voltage pulse train indicates that an upper switching device S1, S3, 55 is open (and a corresponding lower switching device S2, S4, S6 is closed by a corresponding opposite voltage pulse train (not shown)). The patterns of the voltage pulse trains in FIG. 5 are symmetrical to a center axis 50 that represents a half pulse width period tp.

The voltage pulse trains are sorted in FIG. 5 from highest voltage (longest time a signal is high) to lowest voltage (shortest time signal is low). Reference V_h refers to the first voltage pulse train and may be associated with the highest voltage signal to be applied to one of the upper switching device S1, S3, S5. Reference V_m refers to the second voltage pulse train and may be associated with the medium voltage signal to be applied to one of the upper switching device S1, S3, S5. Reference V_l refers to the third voltage pulse train and may be associated with the lowest voltage signal to be applied to one of the upper switching device S1, S3, S5.

FIG. 5 shows four time slots t0_1, t0_2, t0_3 and t0_4 that correspond to times during the period Tp that no current is passing through DC link (zero vector states V0, V7). FIG. 5 also shows a pair of first time periods t1 and a pair of second time periods t2. As mentioned above, the first time period t1 refers to the period of time that vector V1 is applied. The second time period t2 refers to the period of time that vector V2 is applied. Vectors V1 and V2 are active vectors. In other words, a current will pass through the DC link during the first and second time periods t1 and t2.

As will be described in more detail below, if the first time period t1 is sufficiently long enough, a current through at least one of the three phases may be measured or sampled the first during time period t1. If the second time period t2 is sufficiently long enough, a current through at least another of the three phases may be measured or sampled during the second time period t2. If a current measurement can be sampled for at least two of the three phases of the motor, then the current through the third phase may then be calculated. The sum of all three currents must be zero as shown in the following relation:

$$i\_h+i\_m+i\_l=0 \quad (5)$$

In the timing diagram shown in FIG. 5, during the first time period t1, a sample of the current from sensor 32 on the DC link will reflect the current through one of the three phases of the motor 26. In this case, sampling the current from sensor 32 (i_dc_link) will reflect the current through the phase associated with the highest voltage signal (i_h). Similarly, during the second time period t2, a sample of the current from sensor 32 (i_dc_link) will reflect the current through the lowest voltage signal (–i_l). The current for the phase associated with the middle voltage signal (i_m) may be calculated using relation (5).

Problems may occur when using SVPWM signals if the time periods for either (or both) of the time periods t1 or t2 for the active vectors are very small or nonexistent. When the time periods t1 or t2 for the active vectors are very small or nonexistent, the system is not able to measure the currents through at least two phases of the windings in the motor 26. As shown in relation (5), the currents through at least two phases of the windings in the motor 26 are necessary to calculate the current through all three phases.

Figure 6:
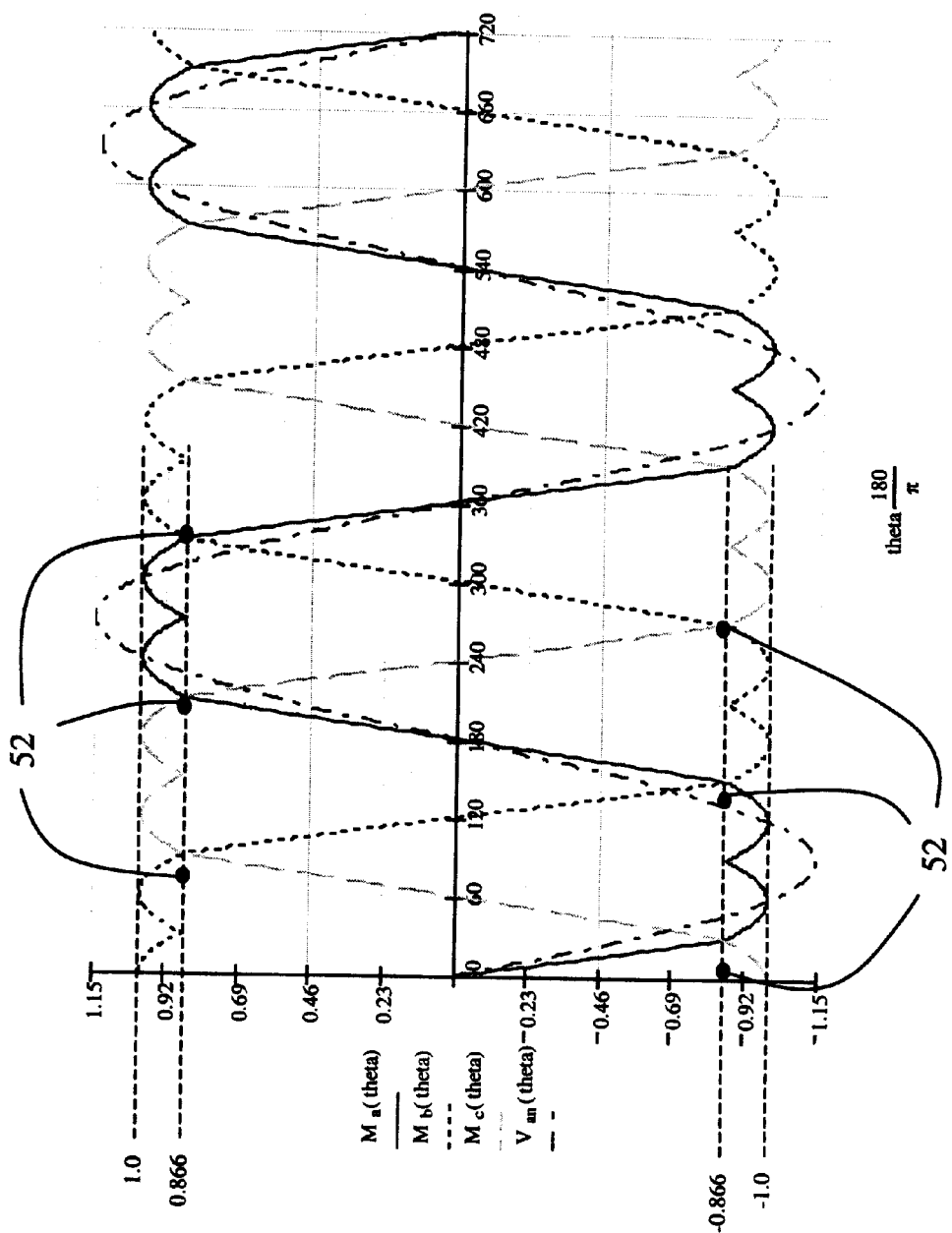
FIG. 6 is a graph of natural SVPWM signals for a three-phase inverter at maximum output.

Known systems have attempted to shift certain pulse trains within a period to achieve a certain sampling window or time period to measure currents. However, known methods have not accounted for each case that may occur in SVPWM schemes. This can be further explained in the context of the graph in FIG. 6. FIG. 6 illustrates a graph of the natural SVPWM signals for a three-phase inverter or switching circuit at maximum output. In pulse width modulation schemes, the pulse width modulated signal is not constant. Rather, the signal is on for a part of the period and off for another part of the period. The duty cycle of a pulse width modulated signal refers to the percentage of time that the signal is on during a specific pulse width period. The duty cycle can be anywhere from 0 (signal always off) to 1 (signal always on). The graph in FIG. 6 provides a plot of the modulation signals at maximum output for the three phases (as a function of duty cycle) versus the voltage vector angle theta (θ) (in electrical angular degrees). In particular, the vertical axis of the graph in FIG. 6 is a function of the duty cycle defined by the following relations:

$$M_a=(D_a*2)-1 \quad (6)$$

$$M_b=(D_b*2)-1 \quad (7)$$

$$M_c=(D_c*2)-1 \quad (8)$$

In the above relations, $D_a$ is the duty cycle for the signal controlling the signal for switching device S1 associated with the first phase winding A; $D_b$ is the duty cycle for the signal controlling the signal for switching device S3 associated with the second phase winding B; $D_c$ is the duty cycle for the signal controlling the signal for switching device S5 associated with the third phase winding C.

As explained above, the benefit of using SVPWM signals to control the switching circuit is that it will provide 15% more output voltage compared to a conventional sinusoidal pulse width modulation schemes. This is shown in the graph of FIG. 6 in relation to the phase voltage associated with phase A ($V_{an}$). When the amplitude for $M_a$ is 1.0, the following relation exists when the output is maximum:

$$V_{an}=(V_{batt}*1.15)/2 \tag{9}$$

In the above relation, $V_{batt}$ is the battery voltage. Although the output voltage is better for systems using SVPWM signals, SVPWM requires more complex schemes compared to conventional sinusoidal pulse width modulation schemes for phase current measurements through the DC link.

Referring to FIG. 6, when the voltage output is maximum, the modulating signal of two different phases crosses each other at 0.866 and −0.866 at points 52. If the switching period is set to 50 microseconds (μs), the SVPWM phase can only be shifted forward or backward 3.35 μs to create a sampling window. This may not be sufficient room to shift the phases according to known methods to make reliable and accurate current measurements. In conventional sinusoidal pulse width modulation schemes, the two different phases cross each other at 0.5 or −0.5. For the same pulse width modulation period, it can move 12.5 μs before it reaches the boundary. Thus, known methods of shifting phases are more suitable for conventional sinusoidal pulse width modulation schemes. What is needed is an improved procedure to take into account these limitations yet still utilizes SVPWM because of its ability to provide better output voltage. The phase current measurement procedures described herein are suitable for SVPWM operation and overcome the problems of the prior art.

Accordingly, the present invention takes into account the different cases where the currents through at least two phases of the windings in the motor 26 cannot be measured or sampled. As explained in more detail below, depending on the specific case, the SVPWM signals are shifted in certain ways to allow a sufficient sampling window (or time period) for measuring a current across the sensor 32 on the DC link. In order to ensure sufficient sampling window for valid DC-link current measurement, each case is identified and then appropriate shifts or modifications to the SVPWM signals are made by the controller of the system based on the identified case.

In one embodiment, generally, there is a method for measuring the current in each phase of a three-phase motor 26 by the sensor 32, the motor 26 being controlled by a plurality of switching devices S1–S6 that receive pulse width modulation signals from the controller 34. The method includes the monitoring of the modulation index for the pulse width modulation signals during a pulse width modulation cycle. The cycle has first, second, and third voltage pulse trains associated with a highest output, a middle output and a lowest output, respectively. The method then uses the monitored modulation index to determine how to shift the voltage pulse trains.

In one embodiment, monitoring a first and second sampling window monitors the modulation index. The first and second sampling windows are time periods within the cycle that may allow certain current measurements to be taken. For adequate current measurement, these windows should be greater than a minimum window. When both the first and second sampling windows are less than the minimum sampling window, the voltage pulse trains associated with the highest output (V_h) and the lowest output (V_l) are shifted to form a first modified sampling window and a second modified sampling window. In this embodiment, the voltage pulse train associated with a middle output (V_m) is not shifted. The method then samples a first current and a second current during the first and second modified sampling windows, respectively. A third current may be calculated based on the sampling of the first and second currents.

When the first sampling window is less than the minimum sampling window and the second sampling window is greater than the minimum sampling window, then there is a determination of whether more than one of the voltage pulse trains needs to be shifted to form the first and second modified sampling windows. If it is determined that not more than one of the voltage pulse trains needs to be shifted, then the voltage pulse train associated with the highest output (V_h) is shifted. If it is determined that more than one of the voltage pulse trains needs to be shifted, then the voltage pulse trains associated with the highest output (V_h) and the middle output (V_m) are shifted. The method may then sample the first current and the second current during the first and second modified sampling windows, respectively. The third current may be calculated based on the sampling of the first and second currents.

When the first sampling window is greater than the minimum sampling window and the second sampling window is less than the minimum sampling window, then there is a determination of whether more than one of the voltage pulse trains needs to be shifted to form the first and second modified sampling windows. If it is determined that not more than one of the voltage pulse trains needs to be shifted, then the voltage pulse train associated with the lowest output (V_l) is shifted. If it is determined that more than one of the voltage pulse trains needs to be shifted, then the voltage pulse trains associated with the lowest output (V_l) and the middle output (V_m) are shifted. The method may then sample the first current and the second current during the first and second modified sampling windows, respectively. The third current may be calculated based on the sampling of the first and second currents.

The pulse width modulation control in the present invention is preferably based on a half pulse width modulation cycle. Under some conditions, the first half pulse width and the second half pulse width are intentionally made different (phase shifted) to create sufficient sampling windows for current measurement.

Figure 7:
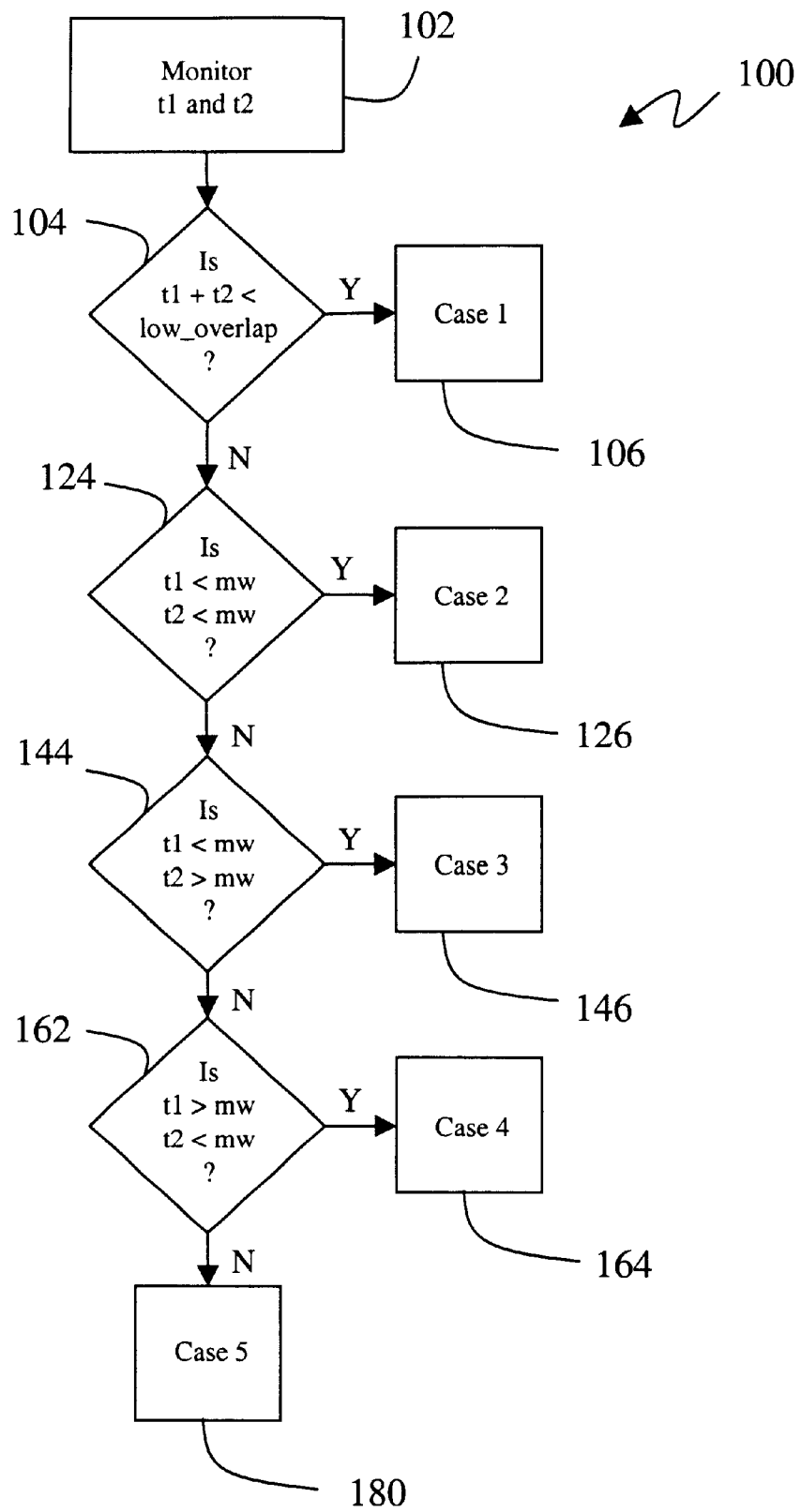
FIG. 7 is a flow chart of a method for identifying specific cases where modification or shifting of SVPWM signals may be needed according to one embodiment of the present invention.

FIG. 7 illustrates one embodiment of a method 100 of the present invention. Generally, the present invention includes a method 100 that monitors the modulation index of the SVPWM signals. As described above, the amplitude of the voltage space vector $V_{\alpha\beta}$ can be described by a modulation index. The voltage space vector $V_{\alpha\beta}$ is a function of the first time period t1 and the second time period t2. Thus, monitoring the first time period t1 and the second time period t2 allows, in one embodiment, the monitoring of the modulation index. The first time period t1 and the second time period t2 may also be referred to as the first sampling window and the second sampling window, respectively.

When one or both of the time periods t1, t2 (or sampling windows) are less than predetermined values, modifications to the natural SVPWM are carried out by various cases. In one embodiment, the method 100 in FIG. 7 can be carried out in a scheme that includes a plurality of control loop periods, each having a plurality of pulse width modulation cycles. For example, the control loop period may be 300 $\mu$s and may contain six pulse width modulation cycles of 50 $\mu$s. In this scheme, the monitoring of sampling windows or time periods t1 and t2 may take place during a first cycle in one control loop period and the shifting or modifications to the natural SVPWM can be carried out in at least one (or all) of the cycles in another control loop period.

Referring to FIG. 7, in one embodiment, the method 100 includes at block 102 the monitoring and determining of a first time period t1 and a second time period t2 in a first half period of a pulse width modulation cycle. After the determination of the first time period t1 and the second time period t2, the process proceeds to decision block 104.

Figure 8A:
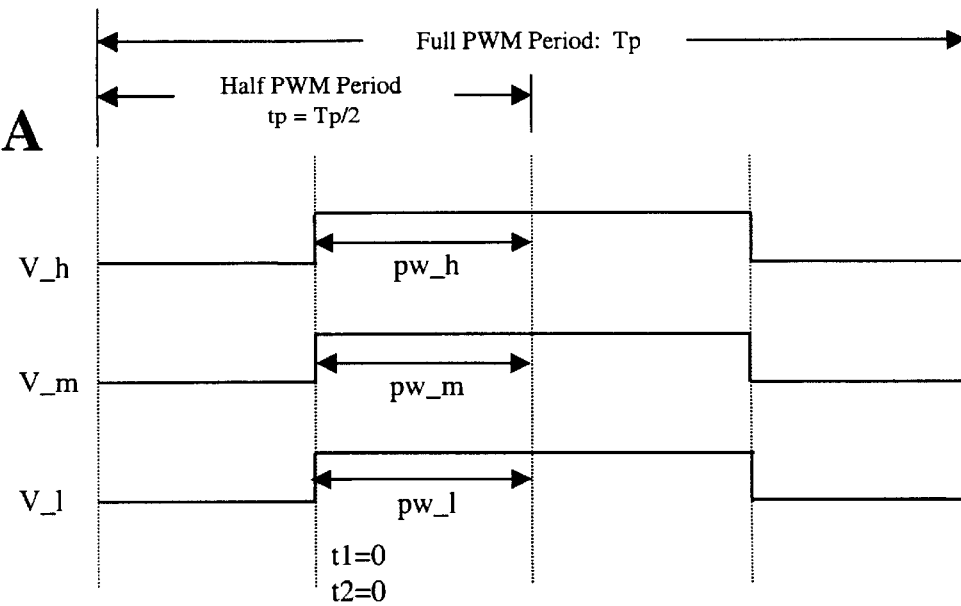
FIGS. 8A and 8B are timing diagrams illustrating one case where modification or shifting of SVPWM signals may be needed according to one embodiment of the present invention.

At decision block 104, a determination is made whether the sum of the first time period t1 and the second time period t2 (t1+t2) is less than a predetermined low overlap (low_overlap). Another way of describing this is whether the modulation index is very small. The predetermined low overlap is implementation specific based on the type of controller used but is a very small value. For example, in one embodiment, the predetermined low overlap is set to around 0.9 $\mu$s. In sum, the predetermined low overlap essentially checks whether the symmetric pulse trains for the three signals (high, medium, low) to the switching devices S1, S3, S5 have no or nominal overlap. One example of symmetric voltage pulse trains for three signals (high, medium, low) having no overlap is shown in FIG. 8A. If the sum of the first time period t1 and the second time period t2 is less than the predetermined low overlap, the process proceeds to process block 106 where case 1 is performed. Here, in FIG. 8A, the sum of the first time period and the second time period is zero and less than the predetermined low overlap.

Figure 8B:
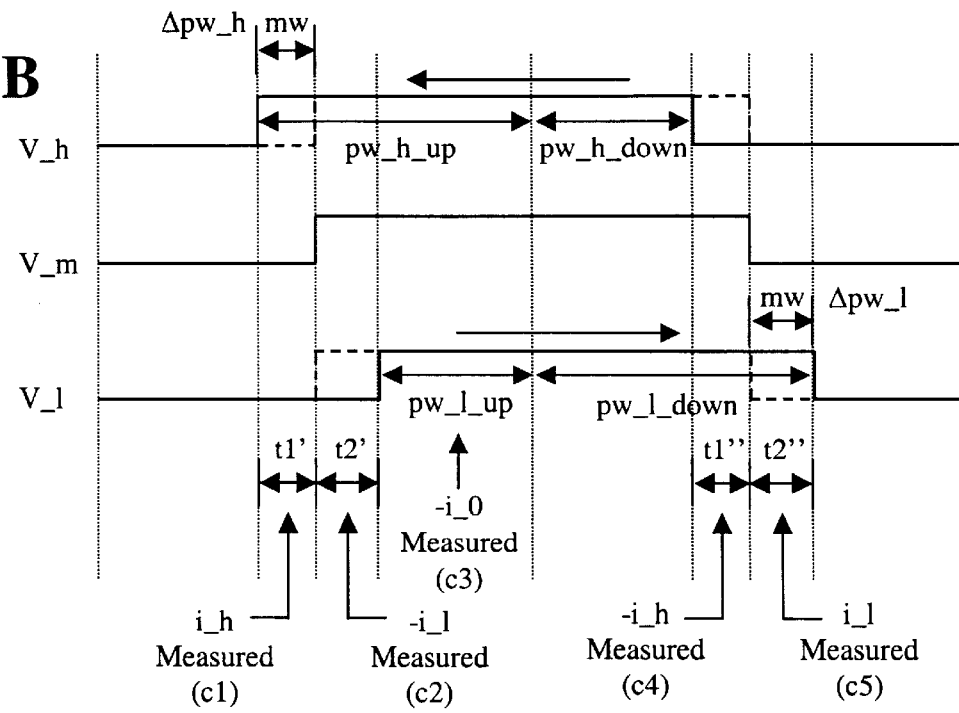

For case 1, in one embodiment, the pulse width modulated signals are modified as shown in FIG. 8B. The dotted voltage pulse trains in FIG. 8B reflect the original voltage pulse trains shown in FIG. 8A. The solid voltage pulse trains in FIG. 8B reflect the voltage pulse trains modified during case 1. Generally, the voltage pulse train associated with the phase having the highest voltage V_h is shifted to the left a first time distance to form a set of first modified time periods or sampling windows t1', t1". The voltage pulse train associated with the phase having the lowest voltage V_l is shifted to the right a second time distance to form a set of second modified time periods or sampling windows t2', t2". The voltage pulse train associated with the phase having the middle voltage V_m is not shifted. After the voltage pulse trains are shifted, a current measurement on the DC link is taken and recorded during a set of first sampling windows t1', t1" and during a set of second sampling windows t2', t2". The current measurements associated with the first sampling windows t1', t1" are preferably averaged to form an averaged first current measurement. The averaged first current measurement reflects the current for one of the three phases. The current measurements associated with the second sampling windows t2', t2" are averaged to form an averaged second current measurement. The averaged second current measurement reflects the current for another phase. Since the currents of two of the three phases are now known, the current flowing through the third phase may be calculated using relation (5) described above.

Figure 9:
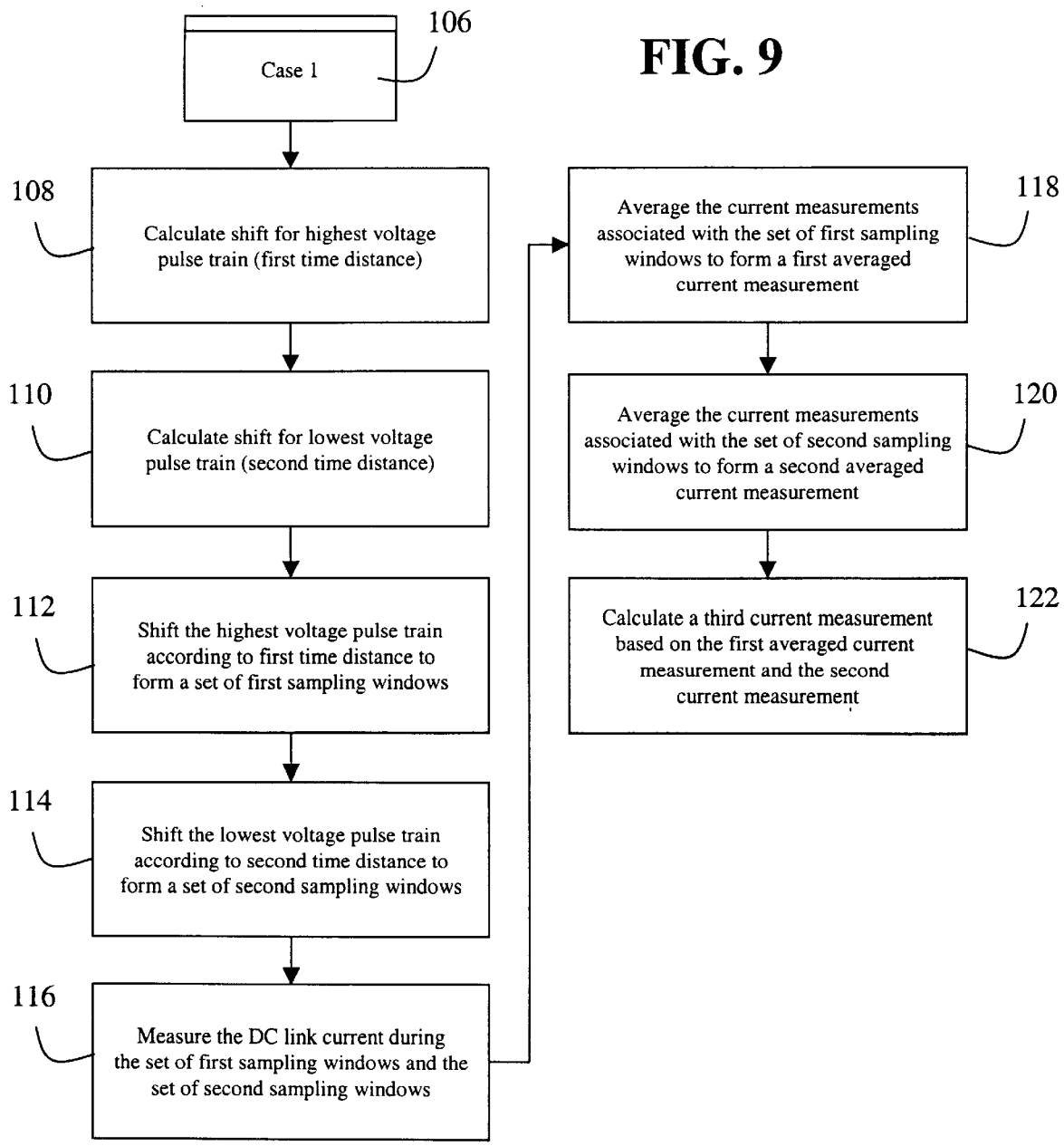
FIG. 9 is a flow chart of one method of shifting the SVPWM signals in FIGS. 8A and 8B and sampling current measurements for various phases.

One suitable embodiment of a process in case 1 (block 106) is further described in relation to the flow chart in FIG. 9. At block 108, the process includes calculating an appropriate shift associated with the voltage pulse train for the highest voltage V_h. The amount of shift may be referred to as a first time distance. Since the original voltage pulse trains in case 1 has an original first time period t1 of zero or almost zero, shifting the voltage pulse train for the highest voltage V_h a first time distance may provide a modified first sampling window that is adequate for sampling or measuring a current through one of the three phase windings.

The calculation of an appropriate shift (or first time distance) associated with the voltage pulse train for the highest voltage V_h may be based on a predetermined minimum window mw. The predetermined minimum window mw is implementation specific based on the inverter and current sensing circuitry used. For one implementation, a suitable minimum window mw is about 4.5 $\mu$s. The minimum sampling window essentially takes into account the time period for the pulse train to settle down after going from a low state to a high state (or vice versa). A "current ringing" may occur at these points. A current that is measured or sampled during the current ringing is not reliable and may induce errors. Thus, the minimum sampling window is the amount of time necessary for reliable DC link current sensing.

In one embodiment, the first time distance ($\Delta pw\_h$) may be expressed in the following relation:

$$\Delta pw\_h = mw - t1 \tag{10}$$

When the reference space vector is zero (t1=0), the first time distance will equal the minimum window mw. FIGS. 8A and 8B show pulse width modifications for t1=0.

Referring back to FIG. 9, after calculating an appropriate shift (or first time distance) associated with the voltage pulse train for the highest voltage V_h, the process proceeds to block 110. At block 110, the process includes calculating an appropriate shift associated with the voltage pulse train for the lowest voltage V_l. The amount of shift may be referred to as a second time distance. Since the original voltage pulse trains in case 1 has an original second time period t2 of zero or almost zero, shifting the voltage pulse train for the lowest voltage V_l a second time distance may provide a modified second sampling window that is adequate for sampling or measuring another current through the three phase windings.

The calculation of an appropriate shift (or second time distance) associated with the voltage pulse train for the lowest voltage V_l may also be based on a predetermined minimum window mw. In one embodiment, the second time distance ($\Delta pw\_l$) may be expressed in the following relation:

$$\Delta pw\_l = mw = t2 \tag{11}$$

When the reference space vector is zero (t2=0), the second time distance will equal the minimum window mw. FIGS. 8A and 8B show pulse width modifications for t2=0.

Referring back to FIG. 9, after calculating an appropriate shift (or second time distance) associated with the voltage pulse train for the lowest voltage V_l, the process proceeds to blocks 112 and 114. At block 112, the process includes shifting the highest voltage pulse train according to the first time distance ($\Delta pw\_h$) to form a modified set of first sampling windows t1', t1". The shifting of the highest voltage pulse train to form a set of first sampling windows t1', t1" is illustrated in FIG. 8B. At block 114, the process further includes shifting the lowest voltage pulse train according to the second time distance ($\Delta pw\_l$) to form a modified set of second sampling windows t2', t2". The shifting of the lowest voltage pulse train to form a set of second sampling windows t2', t2" is also illustrated in FIG. 8B.

The pulse width modulation control in the present invention may be done on a half pulse width modulation cycle. Under such conditions, the first half pulse width and the second half pulse width are intentionally made different (phase shifted) to create sufficient sampling windows for current measurement. This may be accomplished through the following relations for case 1:

$$pw\_h\_up = pw\_h + \Delta pw\_h \quad (12)$$

$$pw\_h\_down = pw\_h - \Delta pw\_h \quad (13)$$

$$pw\_l\_up = pw\_l - \Delta pw\_l \quad (14)$$

$$pw\_l\_down = pw\_l + \Delta pw\_l \quad (15)$$

These relations are illustrated in FIG. 8B. The relations pw_h_up and pw_l_up map the voltage pulse trains for the first half of a pulse width modulation cycle. The relations pw_h_down and pw_l_down map the voltage pulse trains for the second half of a pulse width modulation cycle.

As described earlier, the pulse width modulation scheme described herein may include individual control loop periods, each having a plurality of pulse width modulation cycles. The monitoring of the sampling windows or time periods may take place during one control loop period and the modifications to the natural SVPWM (to ensure proper current measurements) may take place in the next control loop period. For the pulse width modulation cycles within that next control loop period that do not sample the DC link current, in a preferred embodiment of the present invention, the pulse width of these cycles should be modified the same way as those cycles that are used to measure the DC link current. This will eliminate audible noise at the sub-PWM frequency band.

Referring back to FIG. 9, after the voltage pulse trains are modified, the process may proceed to block 116. At block 116, the process may include the sampling or measuring of currents during the set of first sampling windows and during the set of second sampling windows. This will result in four current measurements (c1, c2, c4, c5) during one pulse width modulation cycle. The process may further include another current measurement (c3) during a time known to have no current through the DC link (−i_0). The other current measurement may be used to verify that the system is operating properly and that there is no unexpected current leakage or shorts.

Figure 10:
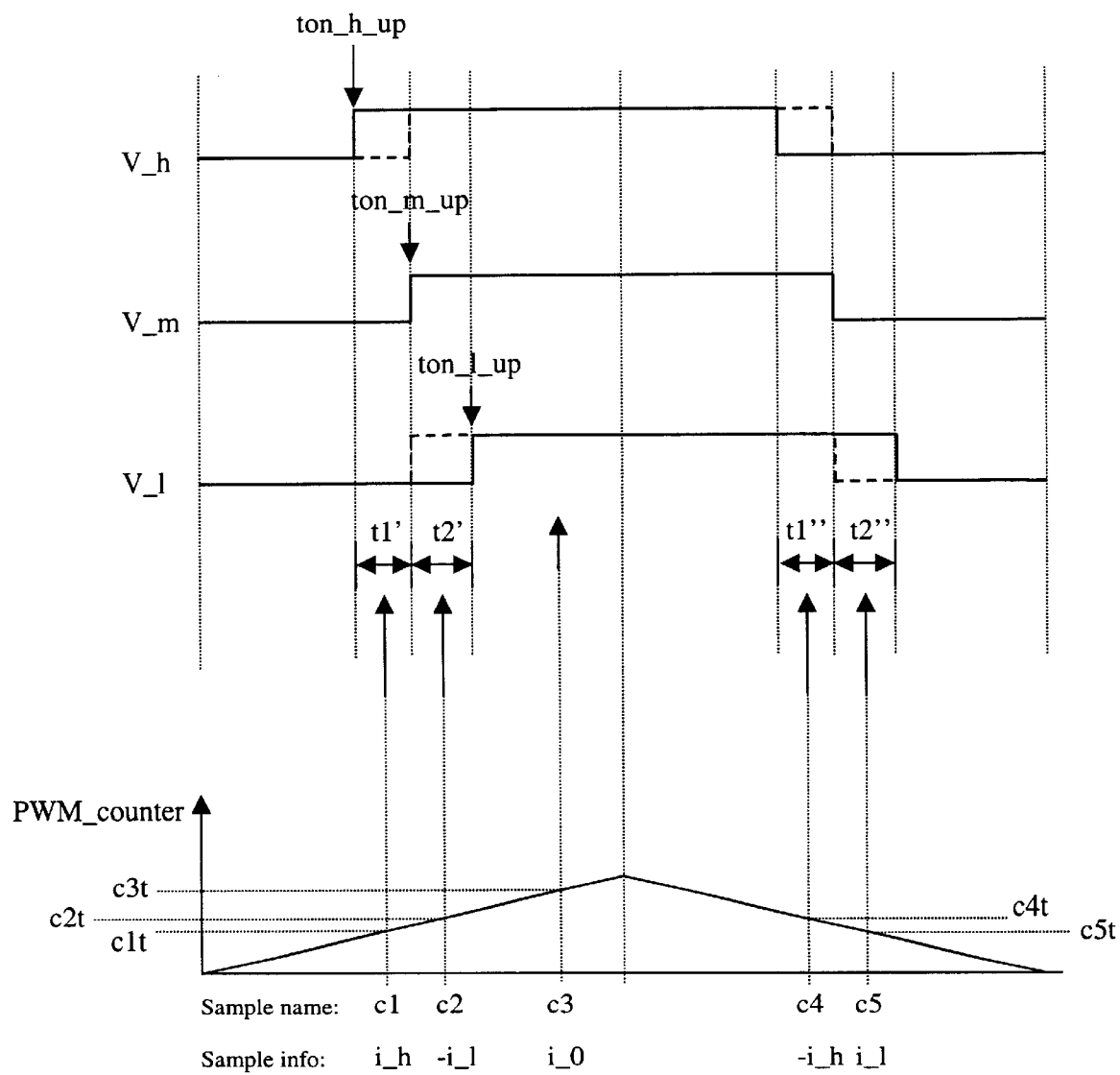
FIG. 10 is a timing diagram and graph for a pulse width modulation counter for sampling current measurements during a pulse width modulation cycle according to one embodiment of the present invention.

In one embodiment, the sampling of current measurements may be done according to a counter or interrupt scheme as illustrated in FIG. 10. A pulse width modulation counter (PWM_counter) is used for determining when a sample or measurement of a current on the DC link is to occur. The values $c1t$, $c2t$, $c3t$, $c4t$, $c5t$ are sample time values calculated in a previous pulse width modulation cycle. These sample time values may be calculated by the following relations:

$$c1t = ton\_h\_up + DELAY\_UP \quad (16)$$

$$c2t = ton\_m\_up + DELAY\_UP \quad (17)$$

$$c3t = PWM\_count_{max} - ZERO\_OS \quad (18)$$

$$c4t = c1t - UD\_OFFSET \quad (19)$$

$$c5t = c2t - UD\_OFFSET \quad (20)$$

In the above relations, ton_h_up and ton_m_up are reference points in the PWM_counter that refer to the point where the voltage pulse train for the highest voltage and the middle voltage change from a low state to a high state, respectively. These points are illustrated in FIG. 10.

In the preferred embodiment, the sample current measurement should take place at or near the middle of the sampling windows t1', t1", t2', t2". Accordingly, the DELAY_UP is selected such that $c1t$ is assigned to the middle of the time slot between ton_h_up and ton_m_up, and such that $c2t$ is assigned to the middle of the time slot between ton_m_up and ton_l_up. DELAY_UP accounts for hardware delays from the pulse width modulation signal to a settled inverter vector state, and is affected by the size of the minimum window mw. Prior systems have taught to sample the DC link close to the end of a valid sampling window. However, error may result in such a case if the inverter peak-to-peak ripple current is significant compared to the motor RMS current. This situation may occur when the motor is idle or running at very low speeds.

PWM_count_max is the maximum PWM counter value, which in one embodiment will be reached at the middle of a full pulse width modulation cycle. ZERO_OS is set to a value such that $c3t$ happens sometime ahead of the half cycle time to allow c3 sampling overhead. UD_OFFSET is a parameter that is set such that $c4t$ and $c5t$ are assigned time slots associated with the second half of the pulse width modulation cycle. UD_OFFSET accounts for the fact that in the second half of the pulse width modulation cycle, a time delay is obtained by subtracting the sample time values because the PWM counter is counting down. After sampling time relative to PWM_counter is calculated, an interrupt based sampling scheduler executes the sampling one by one.

The sampling scheduler may perform as follows in one embodiment. Prior to entering the first sample, an A/D converter sample trigger is set to c1t. In other words, when the PWM_counter reaches the $c1t$ value, the A/D converter starts sampling. The sample count is set to 1. Once the first sample is read, an A/D interrupt is generated. The A/D interrupt service routine may do the following: (1) read the sample count value and branch to a handler routine for the specific sample (c1 through c10); (2) inside each sample routine, a current sample is saved and the next sample number is determined; (3) A/D converter is setup to trigger when the next sample time is matched on the PWM_counter.

Referring to FIG. 10, the PWM_counter is counting up in the first half of the pulse width modulation cycle and counting down in the second half of the pulse width modulation cycle. A single counter value can represent two points in time. One is in the first half of the cycle and the other is in the second half of the cycle. The sample handler should take this fact into account. Alternatively, a dedicated timer could be used for the sampling scheduler. The dedicated timer could count up from zero to a complete pulse width modulation cycle. This would simplify the sample handler routines at the cost of needing an extra timer.

Referring back to FIG. 9, after the current measurements are taken during the set of first sampling windows and the set of second sampling windows, the process may proceed to blocks 118 and 120. At block 118, the process may include averaging the current measurements associated with the first sampling windows to form a first averaged current measurement. At block 120, the process may include averaging the current measurements associated with the second sampling windows to form a second averaged current measurement.

When possible, averaging two or more current measurements for a related phase is preferred. The duplicate current measurements can reduce the error due to random noise and current ringing. This can be done, as in case 1, when the set of first sampling windows t1', t1" and the set of second sampling windows t2', t2"each are greater than a minimum sampling window mw.

In one embodiment, the following relations may be used in blocks 118 and 120 for the averaging process:

$$i\_h=(c1-c4)/2 \quad (21)$$

$$i\_l=(c5-c2)/2 \quad (22)$$

In order to reduce measurement error due to noise in the system, the above DC link current sensing process may be repeated in the next pulse width modulation cycle or period. In that situation, five additional DC link readings will be available. For purposes of illustration, these additional readings will be taken at c6t, c7t, c8t, c9t, and c10t, each corresponding to the above-described readings at c1t, c2t, c3t, c4t, and c5t, respectively, but in the next cycle. The sample names may be referred to as c6, c7, c8, c9 and c10, each corresponding to the above-described sample names c1, c2, c3, c4, c5, respectively, but in the next cycle. Accordingly, when using additional samples from a second pulse width modulation cycle, the following relations may be used in blocks 118 and 120 for the averaging process:

$$i\_h=(c1+c6-c4-c9)/4 \quad (23)$$

$$i\_l=(c5+c10-c2-c7)/4 \quad (24)$$

Referring back to FIG. 9, after performing the averaging processes in blocks 118 and 120, the process in case 1 may proceed to block 122. At block 122, the process may include a determination or calculation of the third current measurement based on the first averaged current measurement and the second current measurement. This calculation may be done using relation (5) since at least two currents are now known. Written in other terms, the relation may be reflected as follows:

$$i\_m=-(i\_h+i\_l) \quad (25)$$

Now that the currents for three phases have been determined in relation to the voltage pulse trains (high, middle, low), there still may need to be a determination of how that information relates to the specific currents passing through each of the phase windings A, B, C of the motor 26. Accordingly, the relationship between the phase currents i_a, i_b, and i_c and i_h, i_m, and i_l can be determined according to the space vector angle, or the specific region in the vector diagram that the voltage vector falls in. The table in FIG. 11 may be used to decode the phase currents.

Figure 12A:
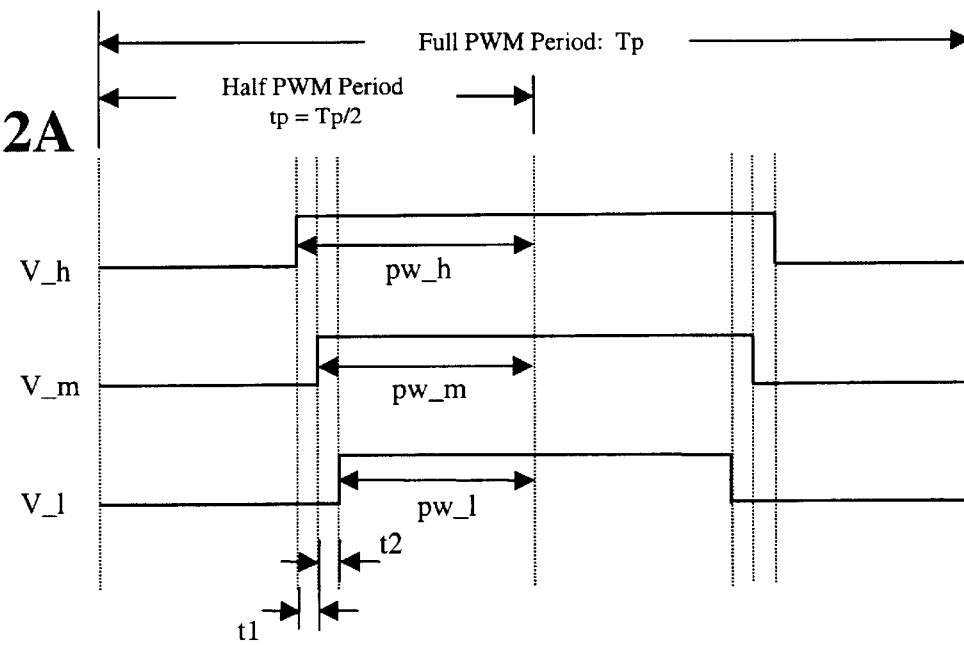
FIGS. 12A and 12B are timing diagrams illustrating another case where modification or shifting of SVPWM signals may be needed according to one embodiment of the present invention.

Referring back to decision block 104 in FIG. 7, if the sum of the first time period t1 and the second time period t2 is not less than the predetermined low overlap, the process proceeds to decision block 124. At decision block 124, a determination is made whether both the first time period t1 and the second time period t2 are less than a predetermined minimum window mw. Another way of describing this is whether the modulation index is small. As described above, the predetermined minimum window mw is implementation specific and based on the type of controller used. The minimum sampling window essentially takes into account the time period for the pulse train to settle down after changing states. FIG. 12A shows one example where both the first time period t1 and the second time period t2 are less than a predetermined minimum window mw. If both the first time period t1 and the second time period t2 are less than a predetermined minimum window mw then the process proceeds to block 126 where case 2 is performed.

Figure 12B:
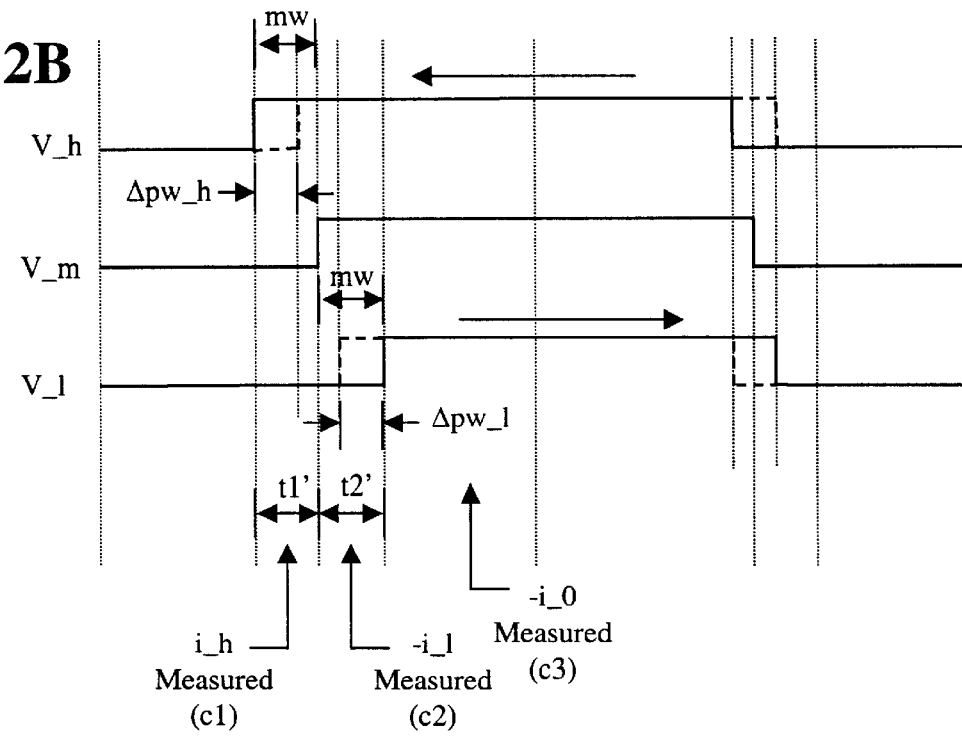

For case 2, in one embodiment, the pulse width modulated signals are modified as shown in FIG. 12B. The dotted voltage pulse trains in FIG. 12B reflect the original voltage pulse trains shown in FIG. 12A. The solid voltage pulse trains in FIG. 12B reflect the voltage pulse trains modified in case 2. Generally, the voltage pulse train associated with the pulse having the highest voltage V_h is shifted to the left a first time distance to form a first sampling window t1'. The voltage pulse train associated with the pulse having the lowest voltage V_l is shifted to the right a second time distance to form a second sampling window t2'. The voltage train associated with the phase having the middle voltage V_m is not shifted. After the voltage pulse trains are shifted, a current measurement on the DC link is taken and recorded during the first sampling t1' and during the second sampling window t2'.

As shown in FIG. 12B, adequate first and second time periods t1' and t2' may only be achieved in the first half of a pulse width modulation cycle. The first and second sampling windows in the second half of the pulse width modulation cycle are smaller than the predetermined minimum window. Accordingly, only one sample (c1, c2) of the first and second sampling windows t1' and t2' may be done during a single pulse width modulation cycle. Thus, to achieve more accurate measurements, another embodiment of the present invention includes duplicating the modification of the voltage pulse trains in consecutive pulse width modulation cycles. This forms a set of first sampling windows and a set of second sampling windows across consecutive pulse width modulation cycles. The current measurements (c1, c6) associated with the first sampling windows t1' are averaged to form an averaged first current measurement. The averaged first current measurement reflects the current for one of the three phases. The current measurements (c2, c7) associated with the second sampling windows t2' are averaged to form an averaged second current measurement. The averaged second current measurement reflects the current for another phase. Since the currents of two of the three phases are now known, the current flowing through the third phase may be calculated using relation (5) described above.

Figure 13:
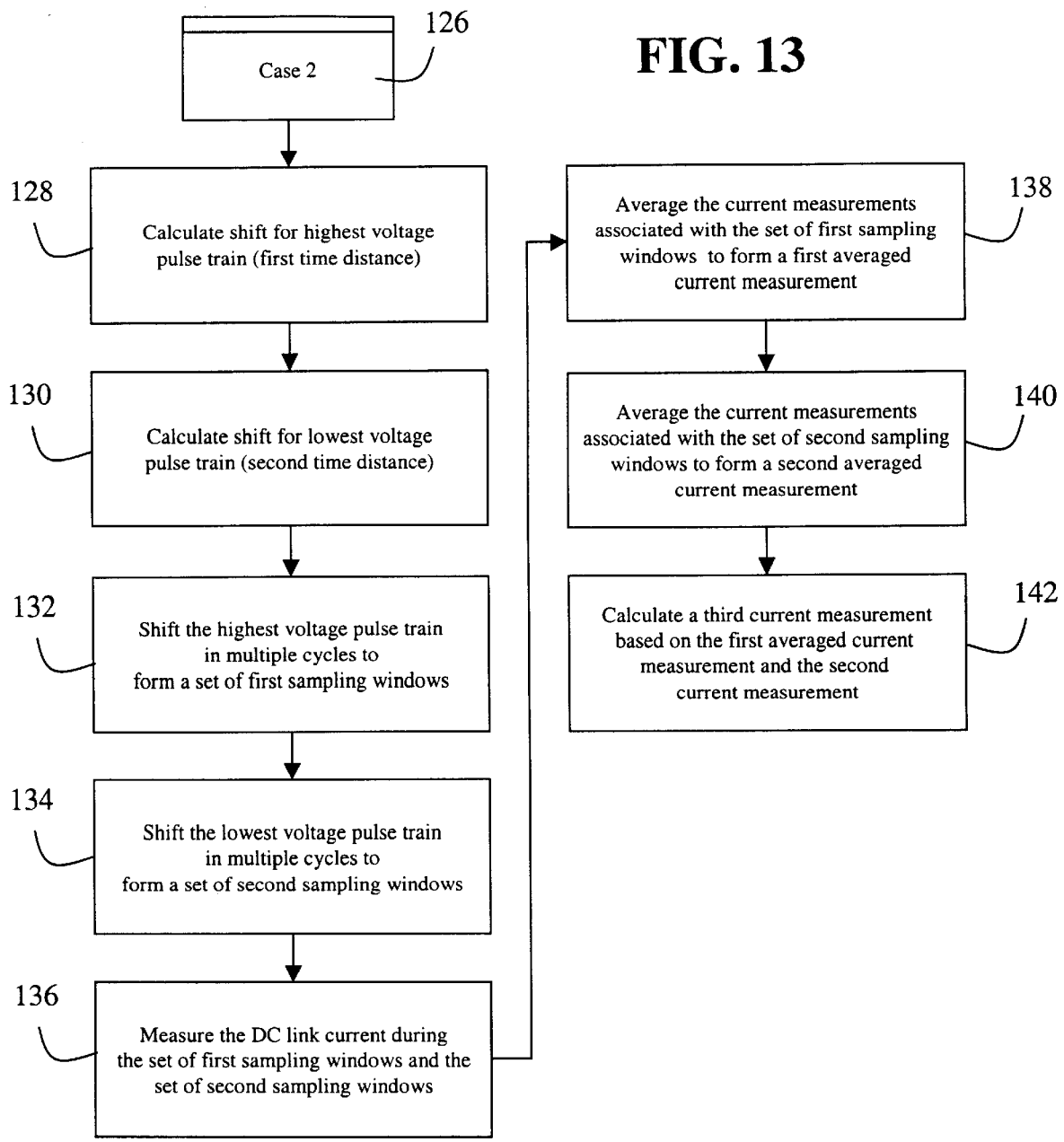
FIG. 13 is a flow chart of one method of shifting the SVPWM signals in FIGS. 12A and 12B and sampling current measurements for various phases.

One suitable embodiment of a process in case 2 (block 126) is further described in relation to the flow chart in FIG. 13. At block 128, the process includes calculating an appropriate shift associated with the voltage pulse train for the highest voltage V_h. The amount of shift may be referred to as a first time distance. Since the original voltage pulse train in case 2 has an original first time period t1 below the predetermined minimum window mw, shifting the voltage pulse train for the highest voltage V_h a first time distance may provide a modified first sampling window t1' that is adequate for sampling or measuring a current through one of the three phase windings.

The calculation of an appropriate shift (or first distance) associated with the voltage pulse train for the highest voltage V_h may be based on the predetermined minimum window mw. In one embodiment, the first time distance (Δpw_h) may be expressed in the same manner as in relation (10) above. The first time distance (Δpw_h) is shown in FIG. 12B.

Referring back to FIG. 13, after calculating an appropriate shift (or first time distance) associated with the voltage pulse train for the highest voltage V_h, the process proceeds to block 130. At block 130, the process includes calculating an appropriate shift associated with the voltage pulse train for the lowest voltage V_l. The amount of shift may be referred to as a second time distance. Since the original voltage pulse train in case 2 has an original second time period t2 less than the predetermined minimum window mw, shifting the voltage pulse train for the lowest voltage V_l a second time distance may provide a modified second sampling window t2' that is adequate for sampling or measuring another current through the three phase windings.

The calculation of an appropriate shift (or second time distance) associated with the voltage pulse train for the lowest voltage V_l may also be based on a predetermined minimum window mw. In one embodiment, the second time distance ($\Delta pw\_l$) may be expressed in the same manner as in relation (11) above. The second time distance ($\Delta pw\_l$) is shown in FIG. 12B.

Referring back to FIG. 13, after calculating the appropriate shifts (or time distances), the process proceeds to block 132 and 134. At block 132, the process includes shifting the highest voltage pulse train according to the first time distance ($\Delta pw\_h$) to form a modified first sampling window t1' in the first half of the pulse width modulation cycle. The shifting of the highest voltage pulse train to form the first sampling window t1' is illustrated in FIG. 12B. At block 134, the process further includes shifting the lowest voltage pulse train according to the second time distance ($\Delta pw\_l$) to form a modified second sampling window t2' in the first half of the pulse width modulation cycle. The shifting of the lowest voltage pulse train to form the second sampling window t2' is also illustrated in FIG. 12B.

The pulse width modulation control in the present invention may be done on a half pulse width modulation cycle. Under such conditions, the relations (12)–(15) discussed above may be used here in case 2. In one embodiment, at least the pulse width modulation cycle immediately following the cycle being modified is also modified. This will create a set of first sampling windows and a set of second sampling windows.

Referring back to FIG. 9, after the voltage pulse trains are modified, the process may proceed to block 136. At block 136, the process may include the sampling or measuring of currents during the set of first sampling windows and during the set of second sampling windows. As explained above, only one first sampling window and one second sampling window will occur during a single pulse width modulation cycle in case 2. However, in another embodiment, at least two consecutive pulse width modulation cycles are modified the same way to create a set of first sampling windows t1' and a set of second sampling windows t2'. This will result in four current measurements (c1, c2, c6, c7) during a two pulse width modulation cycle. The process may further include additional current measurements (c3, c8) during a time known to have no current through the DC link (−i_0). These additional current measurements during a zero vector may be used to verify that the system is operating properly and that there is no unexpected current leakage or shorts. The additional current measurements may also be used in the averaging process.

In one embodiment, the sampling of current measurements may be done in the same way discussed above in relation to case 1 and FIG. 10. So that an inadvertent current measurement is not taken, the sample time values for ct4 and ct5 may be set to "0". Otherwise, the relations (16)–(20) and the sampling scheduler discussed above are suitable for case 2.

In the situation where only one sample is taken for a single pulse width modulation cycle, the following relations may be used to determine each of the three currents:

$$i\_h = c1 - c3 \tag{26}$$

$$i\_l = -(c2 - c3) \tag{27}$$

$$i\_m = -(i\_h + i\_l) \tag{28}$$

However, to improve the accuracy of the current measurements, a repeated current measurement may be taken in a second and consecutive pulse width modulation cycle. Referring back to FIG. 13, where repeated current measurements are taken, the process may further proceed to block 138 and 140. At block 138, the process may include averaging the current measurements associated with the first sampling windows t1' in two pulse width modulation cycles to form a first averaged current measurement. At block 140, the process may include averaging the current measurements associated with the second sampling windows t2' in two pulse width modulation cycles to form a second averaged current measurement.

In one embodiment, the step of averaging in blocks 138 and 140 may include an average of the current samples. The averaging process may also be done according to the following relations:

$$i\_h = (c1 + c6 - c3 - c8)/2 \tag{29}$$

$$i\_l = -(c2 + c7 - c3 - c8)/2 \tag{30}$$

In the above relations, c6, c7, c8 are sampling names associated with c1, c2, c3, respectively, but taken in the next cycle.

Referring back to FIG. 13, after performing the averaging process in blocks 138 and 140, the process in case 2 may proceed to block 142. At block 142, the process may include a determination or calculation of the third current measurement based on the first current measurement and the second current measurement. This calculation may be done using relation (28) discussed above.

Now that the currents for three phases have been determined in relation to the voltage pulse trains (high, middle, low), the table in FIG. 11 may be used to correlate the currents i_h, i_m, and i_l to i_a, i_b, and i_c.

Figure 14A:
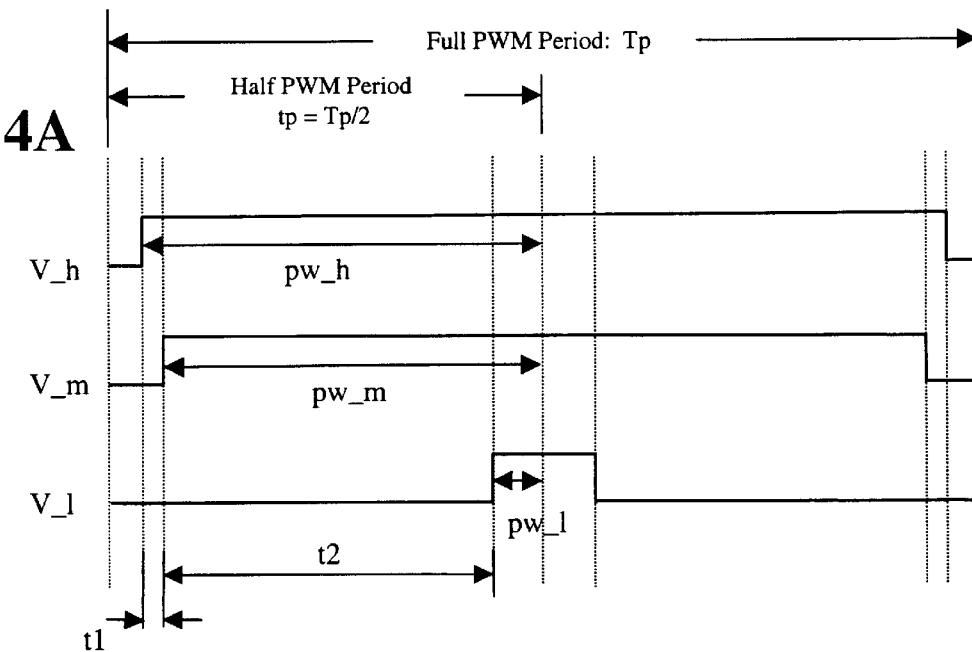
FIGS. 14A and 14B are timing diagrams illustrating another case where modification or shifting of SVPWM signals may be needed according to one embodiment of the present invention.

Referring back to decision block 124 in FIG. 7, if both the first time period t1 and the second time period t2 are not less than a predetermined minimum window mw, then the process proceeds to decision block 144. At decision block 144, a determination is made whether the first time period t1 is less than the predetermined minimum window mw and the second time period t2 is greater than the predetermined minimum window mw. FIG. 14A shows one example where the first time period t1 is less than the predetermined minimum window mw and the second time period t2 is greater than the predetermined minimum window mw. If the first time period t1 is less than the predetermined minimum window mw and the second time period t2 is greater than the predetermined minimum window mw then the process proceeds to block 146 where case 3 is performed.

In case 3, the first time period t1 is too short (or does not exist) to allow for reliable sampling of the current on the DC link during the first time period t1. Before modifying any of the voltage pulse trains, however, a determination is made whether one voltage pulse train or two voltage pulse trains must be modified. After that determination is made, then one or more of the voltage pulse trains are shifted a certain time distance. After one or more of the voltage pulse trains are shifted, a current measurement on the DC link is taken and recorded during the first sampling window t1' and the second sampling window t2'. In a further embodiment, consecutive pulse width modulation cycles are modified and samples taken for the purposes of averaging the measured currents. After at least two of the three phases are known, the current flowing through the third phase is calculated using relation (5) described above.

Figure 15:
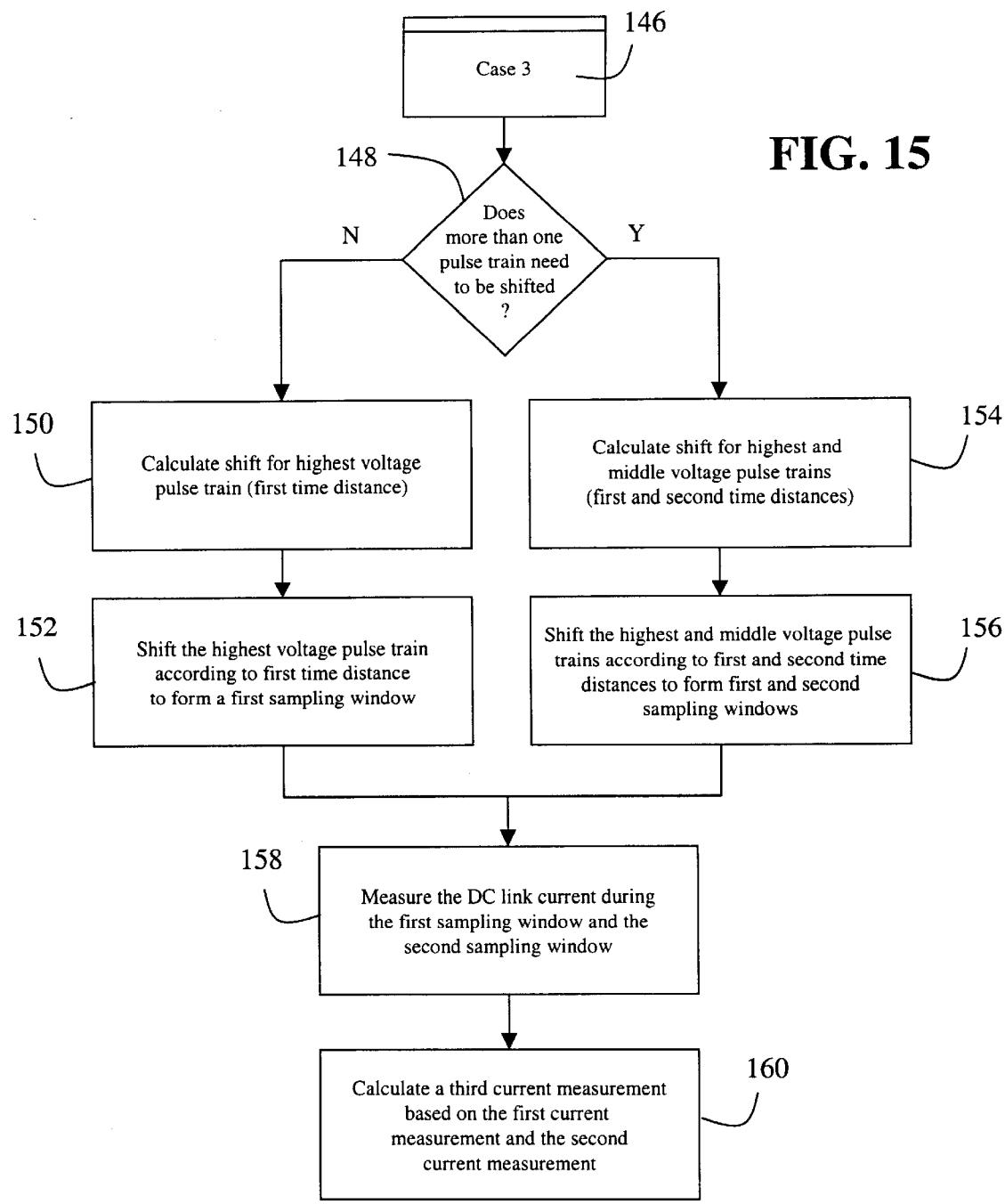
FIG. 15 is a flow chart of one method of shifting the SVPWM signals in FIGS. 14A and 14B and sampling current measurements for various phases.

One suitable embodiment of a process in case 3 (block 146) is further described in relation to the flow chart in FIG. 15. At block 148, the process includes a determination of whether one or more voltage pulse trains need to be shifted or otherwise modified. In essence, what is determined here is whether there is sufficient room within the pulse width modulation cycle to only move the higher voltage pulse train. If there is sufficient space to move only the higher voltage pulse train to provide an adequate sampling window during the first time period, then only the higher voltage pulse train will be shifted. However, if there is not sufficient space to move only the higher voltage pulse train, then both the higher voltage pulse train and the middle voltage pulse train are shifted.

In one embodiment, the determination of whether to shift one or more voltage pulse trains is made based on whether the difference between the period of time for a half pulse width modulation cycle (tp) and the period of time that the higher voltage pulse train is in the upper state during a half cycle (pw_h) is greater than or less than the predetermined minimum window (mw). Both tp and pw_h are illustrated in FIG. 14A. If (tp-pw_h)>(mw), then only the voltage pulse train for the higher voltage needs to be shifted. Referring to FIG. 15, this would move the process from determination block 148 to process blocks 150 and 152. However, if (tp-pw_h)<(mw), then both the voltage pulse trains for the higher and middle voltages need to be shifted. In some hardware implementation, the maximum pulse width is less than 100%. In that situation, if (pw_max-pw_h)<(mw), both the voltage pulse trains for the higher and middle voltages need to be shifted. "pw_max" is the maximum pulse width of the hardware (half cycle pulse width). Referring to FIG. 15, this would move the process from determination block 148 to process blocks 154 and 156.

At block 150, in one embodiment, the process includes calculating an appropriate shift associated with the voltage pulse train for the highest voltage V_h. The amount of shift may be referred to as a first time distance. Since the original first time period t1 in case 3 was less than the predetermined minimum window mw, shifting the voltage pulse train for the highest voltage V_h a first time distance may provide a modified first sampling window t1' that is adequate for sampling or measuring a current through one of the three phase windings.

The calculation of an appropriate shift (or first time distance) associated with the voltage pulse train for the highest voltage V_h may be based on the predetermined minimum window mw. The relation (10) used in case 1 may be used to calculate the first time distance (Δpw_h).

At block 152, the process includes shifting the highest voltage pulse train according to the first time distance (Δpw_h) to form a modified first sampling window t1'. Where only one voltage pulse train is shifted in this case, then the second sampling window t2' will remain the same as the initial second time period t2. The pulse width modulation control in the present invention may be done on a half pulse width modulation cycle. Under this approach, the relations (12) and (13) associated with case 1 may be used. The voltage pulse trains for the middle and lowest voltages are not shifted in block 152.

Block 154 is reached after there has been a determination in block 148 that more than one voltage pulse train needs to be shifted. The reason for having to shift more than one voltage pulse train is the fact that by shifting only the voltage pulse train associated with the highest voltage would not yield a first sampling window that is sufficient for current sampling without moving the voltage pulse train outside the pulse width modulation cycle. Thus, another voltage pulse train must be shifted. In one embodiment, the present invention additionally shifts the voltage pulse train associated with the middle voltage.

Accordingly, in block 154, the process includes calculating an appropriate shift associated with the voltage pulse train for the highest voltage V_h and an appropriate shift associated with the voltage pulse train for the middle voltage V_m. The amount of shifts may be referred to as a first time distance and a second time distance, respectively.

The calculations of appropriate shifts (or first and second time distances) associated with the voltage pulse trains may be based on the predetermined minimum window mw. In one embodiment, the first time distance (Δpw_h) and the second time distance (Δpw_m) may be expressed in the following relations:

$$\Delta pw\_h = tp - pw\_h \quad (31)$$

$$\Delta pw\_m = mw - \Delta pw\_h - t1 \quad (32)$$

If system limitation prevents 100% pulse width, "tp" in equation (31) should be replaced by "pw_max".

Figure 14B:
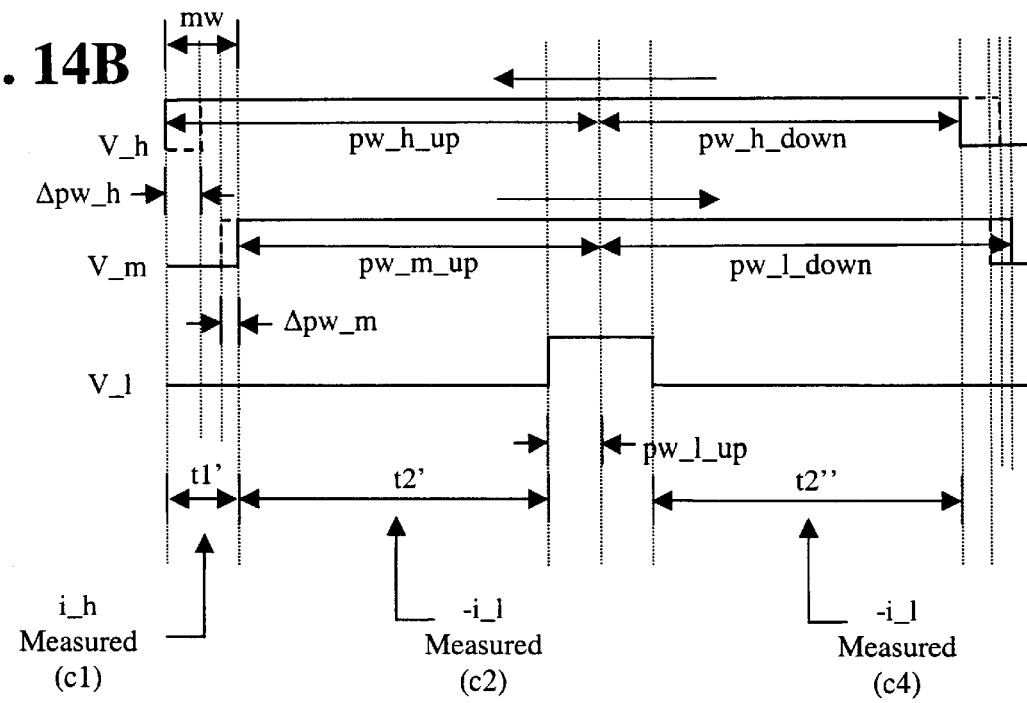

Examples of these shifts are illustrated in FIG. 14B. Referring to FIG. 15, after calculating appropriate shifts (or first and second time distances), the process proceeds to block 156. At block 156, the process includes shifting the highest voltage pulse train (V_h) and the middle voltage pulse train (V_m) according to a first time distance (Δpw_h) and a second time distance (Δpw_m), respectively.

The pulse width modulation control in the present invention may be done on a half pulse width modulation cycle. This may be accomplished through the following relations for case 3:

$$pw\_h\_up = pw\_h + \Delta pw\_h \quad (33)$$

$$pw\_h\_down = pw\_h - \Delta pw\_h \quad (34)$$

$$pw\_m\_up = pw\_m - \Delta pw\_m \quad (35)$$

$$pw\_m\_down = pw\_m + \Delta pw\_m \quad (36)$$

These relations are shown in FIG. 14B. The relations pw_h_up and pw_m_up map the voltage pulse trains for the first half of a pulse width modulation cycle. The relations pw_h_down and pw_m_down map the voltage pulse trains for the second half of a pulse width modulation cycle.

Referring back to FIG. 15, after the voltage pulse trains are shifted in either blocks 152 and 156, the process may proceed to block 158. At block 158, the process may include the sampling or measuring of currents (c1, c2) during the first sampling window t1' and during the second sampling window t2'. As described below, there may be cases where two adequate first sampling windows are formed during a single pulse width modulation cycle. Accordingly, the process in block 158 of case 3 should preferably include a determination of whether multiple current measurements may be taken within a single pulse width modulation cycle. The process may further include another current measurement (c3) during a time known to have no current through the DC link although a determination may also be needed to determine whether the period of no current is sufficiently wide for a reliable measurement.

There are a variety of ways that the sampling may be done. One suitable embodiment is similar to that described above with relation to case 1 (counter system) with a few modifications. Here, the current sampling in case 3 should take into account a determination of whether (after the appropriate shifting) the first sampling window t1' is sufficient large enough in the second half of the pulse width modulation cycle to take a reliable current sample during both the first half and the second half of the pulse width modulation cycle.

In one embodiment, this may be done by comparing the first time period t1 to a predetermined minimum value. The predetermined value is implementation specific but should be very small, close to 0 μs. For purposes of illustration, a predetermined minimum value is referenced herein as MID_OVERLAP. In using the predetermined value MID_OVERLAP, if the first time period t1 is less than MID_OVERLAP, then the system knows that adequate current sample measurements during the first sampling window t1' and the second sampling window t2' may be done in both the first half and second half of a pulse width modulation cycle. In this case, the following relations may apply for sample time values ct1, c2t, c4t and c5t in FIG. 10:

$$c1t = ton\_h\_up + DELAY\_UP \quad (37)$$

$$c2t = (ton\_m\_up + DELAY\_UP + ton\_l\_up)/2 \quad (38)$$

$$c4t = c1t - UD\_OFFSET \quad (39)$$

$$c5t = c2t - UD\_OFFSET \quad (40)$$

If the first time period is not less than NIM_OVERLAP, then the system knows that adequate current sample measurements for the first sampling window t1' and the second sampling window t2' may only be done in the first half of the pulse width modulation cycle. In this case, the following relations may apply for sample time values ct1, c2t, c4t and c5t in FIG. 10:

$$c1t = ton\_h\_up + DELAY\_UP \quad (41)$$

$$c2t = (ton\_m\_up + DELAY\_UP + ton\_l\_up)/2 \quad (42)$$

$$c4t = 0 \quad (43)$$

$$c5t = 0 \quad (44)$$

Alternatively, a value could be set for c4t since it is known that at least another second sampling window t2" can be measured during the second half of the pulse width modulation cycle. This would at least allow for averaging of two current measurements for the second sampling window t2', t2" within a single cycle, making the current measurement associated with the second sampling windows more accurate.

With regard to any current sample measurements (c3) during a zero vector period, there may be cases where the available window is too small to make a reliable measurement. Accordingly, the sampling scheme should take this into account. In one embodiment, this may be done by a determination of whether the variable pw_1_up (shown in FIG. 14B) is greater than or less than a predetermined value ZERO_OS. If the variable pw_1_up is greater than the predetermined value ZERO_OS, then a reliable measurement may be taken during a zero vector period and the following relation may be applied to the sample time value c3t shown in FIG. 10:

$$c3t = PWM\_count_{max} - ZERO\_OS \quad (45)$$

As described earlier, PWM_count_max is the maximum PWM counter value, which in one embodiment will be reached at the middle of a full pulse width modulation cycle.

If the variable pw_1_up is less than the predetermined value ZERO_OS, then a reliable measurement may not be taken during a zero vector period and the following relation may be applied to the sample time value c3t shown in FIG. 10:

$$c3t = 0 \quad (46)$$

If adequate current sample measurements during the first sampling window t1' and the second sampling window t2' may be done in both the first half and second half of a pulse width modulation cycle (t1<MID_OVERLAP), then the following relations may be used for the reconstruction of the phase currents:

$$i\_h = c1 - c3 \quad (47)$$

$$i\_m = c5 - c3 \quad (48)$$

$$i\_l = (-c2 - c4 + 2*c3)/2 \quad (49)$$

If adequate current sample measurements during the first sampling window t1' and the second sampling window t2' may only be done in the first half of a pulse width modulation cycle (t1>MID_OVERLAP), then the following relations may be used for the reconstruction of the phase currents:

$$i\_h = c1 - c3 \quad (50)$$

$$i\_l = -(c2 - c3) \quad (51)$$

$$i\_m = -(i\_h + i\_l) \quad (52)$$

Additional samples of current measurements may also be taken (or repeated) in other pulse width modulation cycles. These additional samples may be averaged together to provide a more accurate reading of the current measurements.

Referring back to FIG. 15, after the current measurements are sampled in block 158, the process proceeds to block 160. At block 160, the process may include a determination or calculation of the third current measurement based on the first current measurement and the second current measurement. This calculation may be done using relation (47) through (52) discussed above.

Now that the currents for three phases have been determined in relation to the voltage pulse trains (high, middle, low), the table in FIG. 11 may be used to correlate the currents i_h, i_m, and i_l to i_a, i_b, and i_c.

Figure 16A:
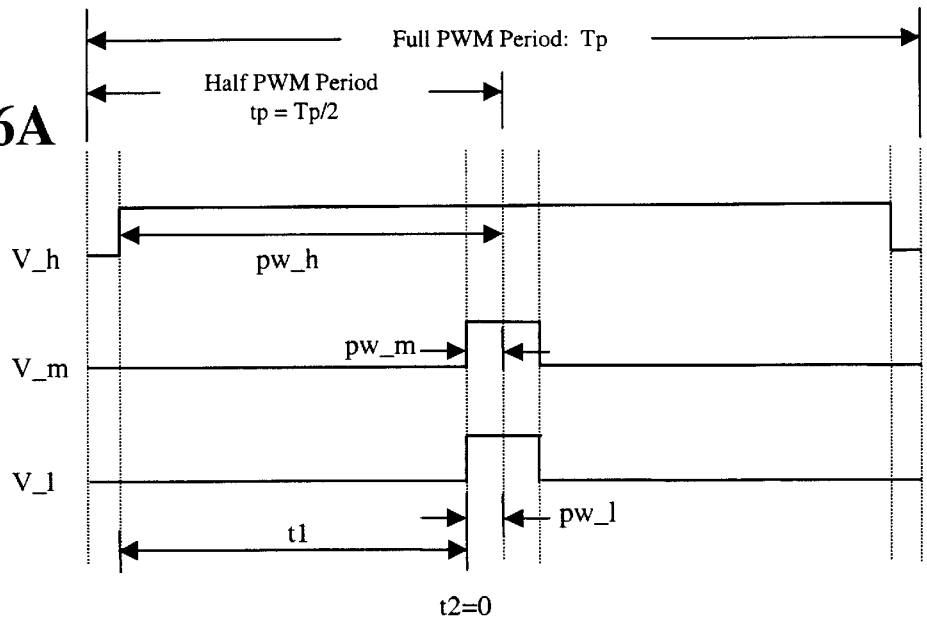
FIGS. 16A and 16B are timing diagrams illustrating another case where modification or shifting of SVPWM signals may be needed according to one embodiment of the present invention.

Referring back to decision block 144 in FIG. 7, if the first time period t1 is not less than the predetermined minimum window mw and the second time period t2 is not greater than the predetermined minimum window mw, then the process proceeds to decision block 162. At decision block 162, a determination is made whether the first time period t1 is greater than the predetermined minimum window mw and the second time period t2 is less than the predetermined minimum window mw. FIG. 16A shows one example where the first time period t1 is greater than the predetermined minimum window mw and the second time period t2 is less than the predetermined minimum window mw. If the first time period t1 is greater than the predetermined minimum window mw and the second time period t2 is less than the predetermined minimum window mw, then the process proceeds to block 164 where case 4 is performed.

In case 4, the second time period t2 is too short (or does not exist) to allow for reliable sampling of the current on the DC link during the second time period t2. Before modifying any of the voltage pulse trains, a determination is made whether one voltage pulse train or two voltage pulse trains must be modified. After that determination is made, then one or more of the voltage pulse trains are shifted a certain time distance. After one or more of the voltage pulse trains are shifted, a current measurement on the DC link is taken and recorded during a first sampling window t1' and a second sampling window t2'. In some cases, there may even be a third sampling window t3' where a current for a third phase may be measured. In a further embodiment, consecutive pulse width modulation cycles are modified and samples taken for the purpose of averaging the measured currents. After at least two of the three phases are known, the current flowing through the third phase may be calculated using relation (5) described above. Additionally, after the third phase is calculated, it may (in some situations) be verified with a third current that is sampled during the cycle.

Figure 17:
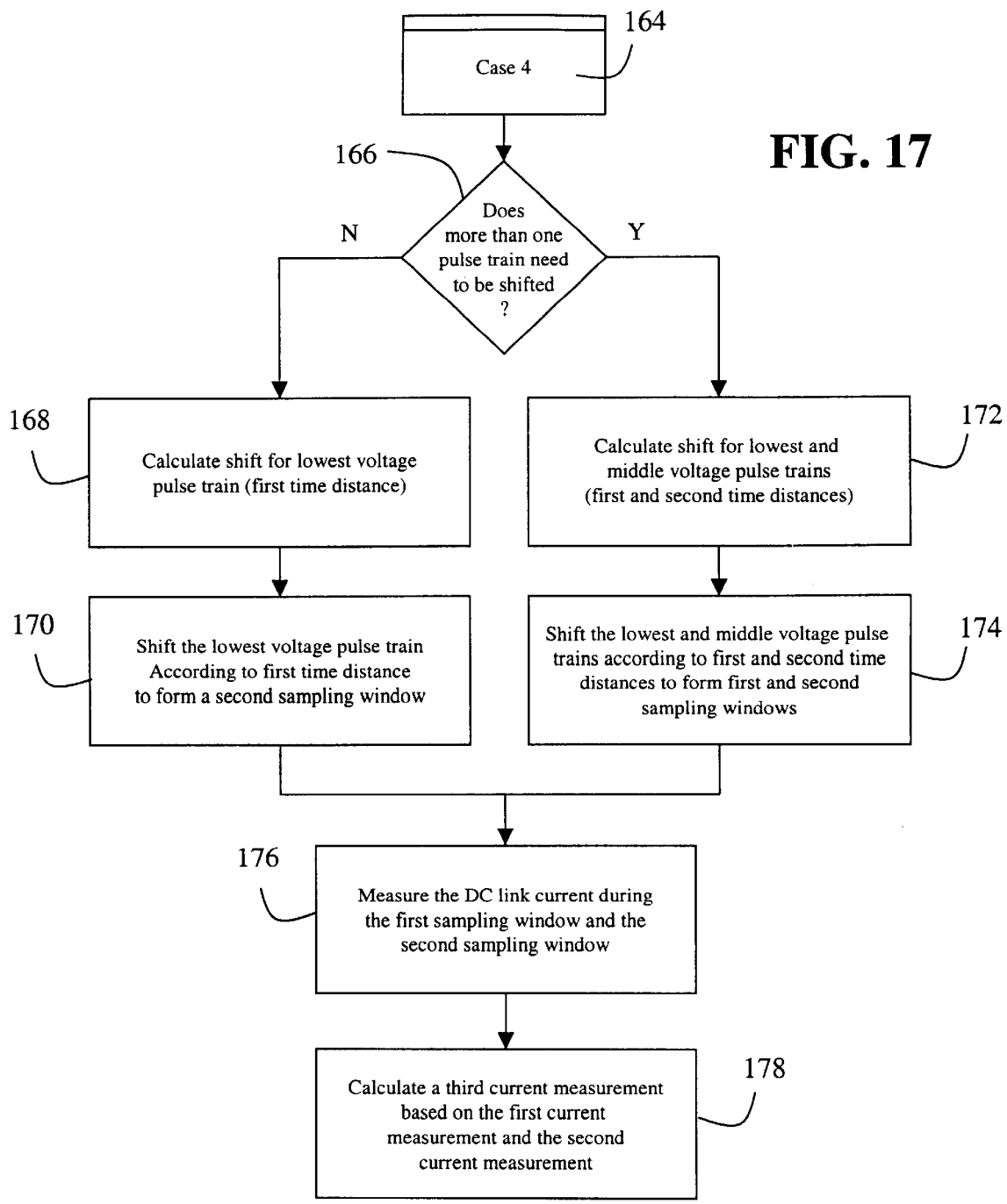
FIG. 17 is a flow chart of one method of shifting the SVPWM signals in FIGS. 16A and 16B and sampling current measurements for various phases.

One suitable embodiment of a process in case 4 (block 164) is further described in relation to flow chart in FIG. 17. At block 164, the process includes a determination of whether one or more voltage pulse trains need to be shifted or otherwise modified. In essence, what is determined here is whether there is sufficient room within a half pulse cycle or period to only move the lower voltage pulse train. If there is sufficient space to move only the lower voltage pulse train, then only the lower voltage pulse train will be shifted. However, if there is not sufficient space to move only the lower voltage pulse train, then both the lower voltage pulse train and the middle voltage pulse train are shifted.

In one embodiment, the determination of whether to shift one or more voltage pulse trains is made based on whether the difference between the period of time for the lower voltage pulse train in the upper state during a half cycle (pw_l) is greater than or less than the difference between the predetermined minimum window (mw) and the second time period (t2). Both the pw_l and the mw are illustrated in FIG. 16A. The second time period t2 in FIG. 16A is shown to be zero in this case. If (pw_l)>(mw−t2), then only the voltage pulse train for the lower voltage needs to be shifted. If there is system limitation that prevent 0% duty cycle, the condition for shifting only single voltage pulse train becomes (pw_l)>(mw−t2+pw_min). "pw_min" is the minimum pulse width due to system limitation. Referring to FIG. 17, this would move the process from determination block 166 to process blocks 168 and 170. However, if (pw_l)<(mw−t2), then both the voltage pulse trains for the lower and middle voltages need to be shifted. Referring to FIG. 17, this would move the process from determination block 166 to process blocks 172 and 174.

At block 168, in one embodiment, the process includes calculating an appropriate shift associated with the voltage pulse train for the lowest voltage V_l. The amount of shift may be referred to as a first time distance. Since the original second time period t2 in case 4 was less then the predetermined minimum window mw, shifting the voltage pulse train for the lowest voltage V_l a first time distance may provide a modified second time period that is adequate for sampling or measuring a current through one of the three phase windings.

The calculation of an appropriate shift (or first time distance) associated with the voltage pulse train for the lowest voltage V_l may be based on the predetermined minimum window mw. The following relation may be used to calculate the first time distance (Δpw_l):

$$\Delta pw\_l = mw - t2 \tag{53}$$

At block 170, the process includes shifting the lowest voltage pulse train according to the first time distance (Δpw_l) to form a modified second sampling window t2'. Where only one voltage pulse train is shifted in this case, then the first sampling window t1' will remain the same as the initial first time period t1. The pulse width modulation control in the present invention may be done on a half pulse width modulation cycle. Under this approach, the relations (14) and (15) associated with case 1 may be used. The voltage pulse trains for the higher and middle lowest voltages are not shifted in block 170.

Block 172 is reached after there has been a determination in block 164 that more than one voltage pulse train needs to be shifted. The reason for having to shift more than one voltage pulse train is the fact that by shifting only the voltage pulse train associated with the lowest voltage would not yield a second sampling window that is sufficient for current sampling without moving the voltage pulse train outside a half pulse width modulation cycle. Thus, another voltage pulse train must be shifted. In one embodiment, the present invention additionally shifts the voltage pulse train associated with the middle voltage.

Accordingly, in block 174, the process includes calculating an appropriate shift associated with the voltage pulse train for the lowest voltage V_l and an appropriate shift associated with the voltage pulse train for the middle voltage V_m. The amount of shifts may be referred to as a first time distance and a second time distance, respectively.

The calculations of appropriate shifts (or first and second time distances) associated with the voltage pulse trains may be based on the predetermined minimum window mw. In one embodiment, the first time distance (Δpw_l) and the second time distance (Δpw_m) may be expressed in the following relations:

$$\Delta pw\_l = pw\_l \tag{54}$$

$$\Delta pw\_m = mw - pw\_l \tag{55}$$

Figure 16B:
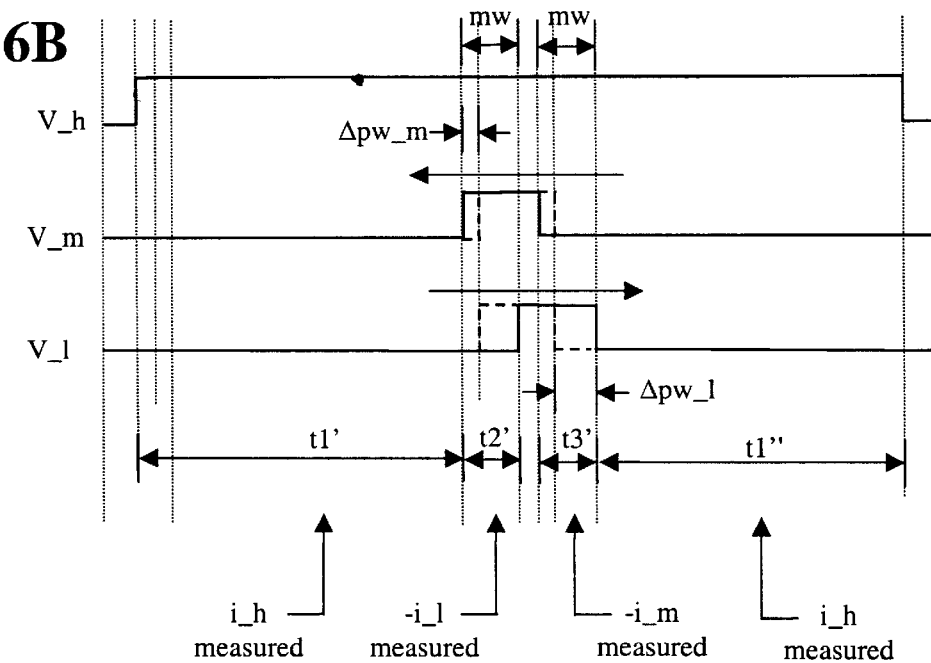

Examples of these shifts are illustrated in FIG. 16B. Referring to FIG. 17, after calculating appropriate shifts (or first and second time distances), the process proceeds to block 174. At block 174, the process includes shifting the lowest voltage pulse train (V_l) and the middle voltage pulse train (V_m) according to a first time distance (Δpw_l) and a second time distance (Δpw_m), respectively.

The pulse width modulation control in the present invention may be done on a half pulse width modulation cycle. This may be accomplished through the following relations for case 4:

$$pw\_l\_up = pw\_l - \Delta pw\_l \tag{56}$$

$$pw\_l\_down = pw\_l + \Delta pw\_l \tag{57}$$

$$pw\_m\_up = pw\_m + \Delta pw\_m \tag{58}$$

$$pw\_m\_down = pw\_m - \Delta pw\_m \tag{59}$$

The relations pw_l_up and pw_m_up map the voltage pulse trains for the first half of a pulse width modulation cycle. The relations pw_l_down and pw_m_down map the voltage pulse trains for the second half of a pulse width modulation cycle. The voltage pulse train associated with the highest voltage is not shifted in block 174.

Referring back to FIG. 17, after the voltage pulse trains are shifted in either blocks 170 or 174, the process may proceed to block 176. At block 176, the process may include the sampling or measuring of currents during the first sampling window t1' and during the second sampling window t2'. As can be seen in FIG. 16B, a set of two first sampling windows t1', t1" exist within a single pulse width modulation cycle. Thus, the current samples (c1, c5) taken in the two first sampling windows t1', t1" can be averaged together. As described below, there also may be cases where two current measurements may be taken for the second sampling windows during a single pulse width modulation cycle. Accordingly, the process in block 176 of case 4 should preferably include a determination of whether multiple current measurements may be taken for the second sampling window within a single pulse modulation cycle. It is also noted that in FIG. 16B, the sample (c4) taken during the second sampling window t3' represents the third phase current −i_m.

There are a variety of ways that the sampling may be done. One suitable embodiment is similar to that described above with relation to case 1 (counter system) with a few modifications. Here, the current sampling in case 4 should take into account a determination of whether (after the appropriate shifting) the second sampling window is sufficient large enough in the second half of the pulse width modulation cycle to take a reliable current sample during both the first half and the second half of the pulse width modulation cycle.

In one embodiment, this may be done by comparing the original second time period t2 to a predetermined minimum value. The predetermined value is implementation specific but should be very small, close to 0 μs. For purposes of illustration, a predetermined minimum value is referenced herein as MID_OVERLAP. In using the predetermined value MID_OVERLAP, if the second time period t2 is less than MID_OVERLAP, then the system knows that adequate current sample measurements during the second time period t2 may be done in both the first half and second half of a pulse width modulation cycle. In this case, the following relations may apply for sample time values c1t, c2t, c4t and c5t in FIG. 10:

$$c1t=(ton\_h\_up+DELAY\_UP+ton\_m\_up)/2 \quad (60)$$

$$c2t=ton\_m\_up+DELAY\_UP \quad (61)$$

$$c4t=c1t-UD\_OFFSET \quad (62)$$

$$c5t=c2t-UD\_OFFSET \quad (63)$$

If the second time period is not less than MID_OVERLAP, then the system knows that adequate current sample measurements for the second time period t2 may only be done in the first half of the pulse width modulation cycle. In this case, the following relations may apply for sample time values c1t, c2t, c4t and c5t in FIG. 10:

$$c1t=(ton\_h\_up+DELAY\_UP+ton\_m\_up)/2 \quad (64)$$

$$c2t=ton\_m\_up+DELAY\_UP \quad (65)$$

$$c4t=0 \quad (66)$$

$$c5t=0 \quad (67)$$

Alternatively, a value could be set for c5t since it is known that at least another first sampling window t1" can be measured during the second half of the pulse width modulation cycle. This would at least allow for averaging of two current measurements for the first sampling window t1', t1" within a single cycle, making the current measurement associated with the first sampling windows more accurate.

With regard to any current sample measurements during a zero vector period, there may be cases where the available window is too small to make a reliable measurement. Accordingly, the sampling scheme should take this into account. In one embodiment, this may be done by a determination of whether the variable pw_1_up is greater than a predetermined value (here, ZERO-OS). If the variable pw_1_up is greater than the predetermined value ZERO_OS, then a reliable measurement may be taken during a zero vector period and the following relation may be applied to the sample time value c3t shown in FIG. 10:

$$c3t=PWM\_count\_max-ZERO\_OS \quad (68)$$

As described earlier, PWM_count_max is the maximum PWM counter value, which in one embodiment will be reached at the middle of a full pulse width modulation cycle.

If the variable pw_1_up is less than the predetermined value ZERO_OS, then a reliable measurement may not be taken during a zero vector period and the following relation may be applied to the sample time value c3t shown in FIG. 10:

$$c3t=0 \quad (69)$$

In FIG. 16B, the variable pw_1_up is zero. Thus, no current measurement for the zero vector in the embodiment in FIG. 16B can be made.

If adequate current sample measurements during the second sampling window in both the first half and second half of a pulse width modulation cycle (t2<MID_OVERLAP), then the following relations may be used for the reconstruction of the phase currents:

$$i\_h=(c1+c5-2*c3)/2 \quad (70)$$

$$i\_m=-(c4-c3) \quad (71)$$

$$i\_l=-(c2-c3) \quad (72)$$

If adequate current sample measurements during the second sampling window may only be done in the first half of a pulse width modulation cycle (t1>MID_OVERLAP), then the following relations may be used for the reconstruction of the phase currents:

$$i\_h\_c1-c3 \quad (73)$$

$$i\_l=-(c2-c3) \quad (74)$$

$$i\_m=-(i\_h+i\_l) \quad (75)$$

Additional samples of current measurements may also be taken (or repeated) in other pulse width modulation cycles. These additional sample may also be averaged together to provide a more accurate reading of the current measurements.

After the current measurements are sampled in block 176, the process may proceed to block 178. The process step in block 178 may be optional depending on whether the situation occurred that allowed for three current measurements during all three time periods t1', t2', t1" and t3' (see FIG. 16B). In any event, it still may be beneficial to calculate a third cur-rent measurement based on the first and second current measurement for comparison purposes. If a calculation is done here, it may be done using the relations (70) through (75) discussed above.

Now that the currents for three phases have been determined in relation to the voltage pulse trains (high, middle, low), the table in FIG. 11 may be used to correlate the currents i_h, i_m, and i_l to i_a, i_b, and i_c.

Referring back to decision block 162 in FIG. 7, the process may proceeds to process block 180. By default of passing through the prior decision blocks 104, 124, 144, 162, this essentially means that both the first time period t1 and the second time period t2 must be greater than the minimum window mw. An example of this scenario is shown in FIG. 5 discussed previously. In case 5 of process block 180, no shifting of the pulse width modulation signals are needed because both the first and second time periods t1 and t2 are large enough to make reliable sample current measurements. It is preferred, however, that five current measurements (c1, c2, c3, c4, c5) be taken during a pulse width modulation cycle. Two of the current measurements (c1, c5) will relate to the first time periods t1 for the first half and second half of the cycle. Two of the current measurements (c2, c4) will relate to the second time periods t2 for the first half and second half of the cycle. Another current measurement (c3) is taken during a time period known to have no current flowing through the DC link.

The measurements associated with each time periods may be averaged together to provide a more accurate measurement of the current through at least two of the three phase windings. Additionally, the current measurements for the time periods may be averaged together by taking into account the current measurement taken during a zero vector state. The following relations may be used:

$$i\_h=(c1+c5-2*c3)/2 \quad (76)$$

$$i\_l=(-c2-c4+2*c3)/2 \quad (77)$$

To determine the current in the third phase (i_m), one may use relation (28) discussed above. Now that the currents for three phases have been determined in relation to voltage pulse trains (high, middle, low), the table in FIG. 11 may be used to correlate the currents i_h, i_m, and i_l to i_a, i_b, and i_c.

The improved procedure of the present invention also provides for simple diagnose of the system hardware during the states described above. This can be safety critical to automobile applications where the three-phase system is used in power steering systems. When the total time period for the time slots t0_2 and t0_3 are sufficiently long (see FIG. 5), a DC-link current sample (i_0) can be taken to determine whether a hardware failure has occurred.

When the current signals are correct, the current sample (i-0) should fall within a predetermined band. If this sample goes outside the predetermined band, an error or fault in the hardware exists. When an error or fault in the hardware exists, the system can be shutdown to avoid unsafe operation.

In one embodiment, the predetermined band is defined by an upper limit (C3_UPPER_LIMF) and a lower limit (C3_LOWER_LIMT). This band may be expressed in terms of a current or in terms of a voltage. The choice of the exact variable for this band is implementation specific but should be decided based on expected values of the current sample measurement when no current is expected to flow through the DC link. The following software may be used to implement this diagnosis approach:

if ((c3>C3_UPPER_LIMIT) OR (c3<C3_LOWER_LIMIT))
   I_SAMPLE_FAULT=TRUE;
else,
   I_SAMPLE_FAULT=FALSE;

In the above software, the variable c3 corresponds to the sample name of the measurement taken during the period shown and described in relation to FIG. 10. The flag I_SAMPLE_FAULT corresponds to whether the system has detected a hardware error. Based on the setting of this flag, the system may provide some warning or simply be set to shut-down.

What has been described is an improved procedure for measuring current flowing in each phase of a three-phase device. The above-described procedure modifies the natural SVPWM based on specific cases and produces minimum phase shifts. The procedure involves monitoring the modulation index for SVPWM signals during a pulse width modulation cycle. When the modulation index is zero or very low (cases 1 and 2), the voltage pulse train associated with the highest and lowest outputs is shifted and the voltage pulse train associated with the middle output is not shifted. When the modulation index is high or maximum, the voltage pulse train associated with the highest output may be increased to create a sampling window (case 3). Alternatively, the voltage pulse train associated with the lowest output may be decreased to create a sampling window (case 4). Additionally, when the modulation index is high or maximum, if the voltage pulse train associated with the highest or lowest output cannot be shifted to provide an adequate sampling window, then the voltage pulse train associated with the middle output may be shifted to create an adequate sampling window (cases 3 and 4).

Some of the advantages of the improved procedure include: (1) provides lower disturbance to the normal SVPWM current waveform; (2) provides enhanced measurement accuracy for low modulation index conditions by measuring currents in both halves of a pulse width modulation period; (3) provides a simple and effective measurement diagnosis for detecting hardware errors; (4) provides the ability to use commercially available DSP controllers, which provide much faster current measurements than traditional microcontrollers.

The above description of the present invention is intended to be exemplary only and is not intended to limit the scope of any patent issuing from this application. For example, the present discussion used a three-phase motor for automobile applications. The present invention is also applicable to other three-phase devices where pulse width modulation is used. The present invention is intended to be limited only by the scope and spirit of the following claims.

What is claimed is:

1. A method for measuring current in each phase of a three-phase power device by a sensor, the three-phase power device controlled by a plurality of pulse width modulation signals, the method comprising the steps of:

monitoring a first and second sampling window for the pulse width modulation signals during a cycle, the cycle having a first voltage pulse train, a second voltage pulse train and a third voltage pulse train associated with each phase of the three-phase power device;

determining whether both the first and second sampling windows are less than a minimum sampling window, if both the first and second sampling windows are less than the minimum sampling window then:
   shifting the first voltage pulse train to form a first modified sampling window;
   shifting the third voltage pulse train to form a second modified sampling window;

determining whether the first sampling window is less than the minimum sampling window and the second sampling window is greater than the minimum sampling window, if the first sampling window is less than the minimum sampling window and the second sampling window is greater than the minimum sampling window then:
   determining whether more than one of the voltage pulse trains needs to be shifted to ensure the first modified sampling window is not less than the minimum sampling window;

27 if it is determined that not more than one of the voltage pulse trains needs to be shifted, then shifting the first voltage pulse train to form the first modified sampling window, the second modified sampling window remaining the same as the monitored second sampling window;

if it is determined that more than one of the voltage pulse trains needs to be shifted, then shifting the first and the second voltage pulse trains to form the first and second modified sampling windows;

sampling a first current during the first modified sampling window by the sensor;

sampling a second current during the second modified sampling window by the sensor; and calculating a third current based on the sampling of the first and second currents.

2. The method of claim 1 wherein the method further includes the steps of:

determining whether the first sampling window is greater than the minimum sampling window and the second sampling window is less than the minimum sampling window, if the first sampling window is greater than the minimum sampling window and the second sampling window is less than the minimum sampling window then:

determining whether more than one of the voltage pulse trains needs to be shifted to ensure the second modified sampling window is not less than the minimum sampling window;

if it is determined that not more than one of the voltage pulse trains needs to be shifted, then shifting the third voltage pulse train to form the second modified sampling window, the first modified sampling window remaining the same as the monitored first sampling window;

if it is determined that more than one of the voltage pulse trains needs to be shifted, then shifting the third and second voltage pulse trains to form the first and second modified sampling windows.

3. The method of claim 1 wherein the method further includes the step of determining whether a failure has occurred by sampling a fourth current by the sensor during a period when no current is expected to flow through the three-phase power device.

4. The method of claim 1 wherein the step of sampling the first current is done at about the middle of the first modified sampling window, and the step of sampling the second current is done at about the middle of the second modified sampling window.

5. The method of claim 1 wherein the steps of sampling the first and second currents are done using a counter, the counter ranging from a minimum value to a maximum value, the minimum value of the counter corresponding to the beginning and end of a cycle, the maximum value of the counter corresponding to the middle of the cycle.

6. The method of claim 1 wherein the steps of sampling of the first and second currents are done in a first cycle of a control loop period, the method further including the steps of:

sampling a fourth current during a second cycle of the control loop period;

sampling a fifth current during the second cycle of the control loop period;

averaging the fourth current and the first current to form an averaged first current; and averaging the fifth current and the second current to form an averaged second current;

28 wherein the step of calculating the third current is further based on the averaged first current and the averaged second current.

7. The method of claim 1 wherein the first voltage pulse train corresponds to the voltage pulse train associated with the highest output within the cycle, the second voltage pulse train corresponds to the voltage pulse train associated with the middle output within the cycle, and the third voltage pulse train corresponds to the voltage pulse train associated with the lowest output within the cycle.

8. The method of claim 1 wherein the method is carried out in a system having a plurality of control loop periods, each period having a plurality of pulse width modulation cycles.

9. The method of claim 8 wherein the cycle during which the step of monitoring the first and second sampling windows is carried out is within one control loop period, and the steps of shifting the voltage pulse trains is carried out in each of a plurality of cycles in another control loop period.

10. A method for measuring current in each phase of a three-phase power device by a sensor, the three-phase power device controlled by a plurality of pulse width modulation signals, the method comprising the steps of:

monitoring a first and second sampling window for the pulse width modulation signals during a cycle, the cycle having a first voltage pulse train, a second voltage pulse train and a third voltage pulse train associated with each phase of the three-phase power device;

determining whether both the first and second sampling windows are less than a minimum sampling window, if both the first and second sampling windows are less than the minimum sampling window then:

shifting the first voltage pulse train to form a first modified sampling window;

shifting the third voltage pulse train to form a second modified sampling window;

determining whether the first sampling window is greater than the minimum sampling window and the second sampling window is less than the minimum sampling window, if the first sampling window is greater than the minimum sampling window and the second sampling window is less than the minimum sampling window then:

determining whether more than one of the voltage pulse trains needs to be shifted to ensure the second modified sampling window is not less than the minimum sampling window;

if it is determined that not more than one of the voltage pulse trains needs to be shifted, then shifting the third voltage pulse train to form the second modified sampling window, the first modified sampling window remaining the same as the monitored first sampling window;

if it is determined that more than one of the voltage pulse trains needs to be shifted, then shifting the third and second voltage pulse trains to form the first and second modified sampling windows;

sampling a first current during the first modified sampling window by the sensor;

sampling a second current during the second modified sampling window by the sensor; and calculating a third current based on the sampling of the first and second currents.

11. The method of claim 10 wherein the method further includes the steps of:

determining whether the first sampling window is less than the minimum sampling window and the second sampling window is greater than the minimum sampling window, if the first sampling window is less than the minimum sampling window and the second sampling window is greater than the minimum sampling window then:
  determining whether more than one of the voltage pulse trains needs to be shifted to ensure the first modified sampling window is not less than the minimum sampling window;
  if it is determined that not more than one of the voltage pulse trains needs to be shifted, then shifting the first voltage pulse train to form the first modified sampling window, the second modified sampling window remaining the same as the monitored second sampling window;
  if it is determined that more than one of the voltage pulse trains needs to be shifted, then shifting the first and the second voltage pulse trains to form the first and second modified sampling windows.

12. The method of claim 10 wherein the method further includes the step of determining whether a failure has occurred by sampling a fourth current by the sensor during a period when no current is expected to flow through the three-phase power device.

13. The method of claim 10 wherein the step of sampling the first current is done at about the middle of the first modified sampling window, and the step of sampling the second current is done at about the middle of the second modified sampling window.

14. The method of claim 10 wherein the steps of sampling the first and second currents are done using a counter, the counter ranging from a minimum value to a maximum value, the minimum value of the counter corresponding to the beginning and end of a cycle, the maximum value of the counter corresponding to the middle of the cycle.

15. The method of claim 10 wherein the steps of sampling of the first and second currents are done in a first cycle of a control loop period, the method further including the steps of:
  sampling a fourth current during a second cycle of the control loop period;
  sampling a fifth current during the second cycle of the control loop period;
  averaging the fourth current and the first current to form an averaged first current; and
  averaging the fifth current and the second current to form an averaged second current;
  wherein the step of calculating the third current is further based on the averaged first current and the averaged second current.

16. The method of claim 10 wherein the first voltage pulse train corresponds to the voltage pulse train associated with the highest output within the cycle, the second voltage pulse train corresponds to the voltage pulse train associated with the middle output within the cycle, and the third voltage pulse train corresponds to the voltage pulse train associated with the lowest output within the cycle.

17. The method of claim 10 wherein the method is carried out in a system having a plurality of control loop periods, each period having a plurality of pulse width modulation cycles.

18. The method of claim 17 wherein the cycle during which the step of monitoring the first and second sampling windows is carried out is within one control loop period, and the steps of shifting the voltage pulse trains is carried out in each of a plurality of cycles in another control loop period.

19. A method for measuring current in each phase of a three-phase power device by a sensor, the three-phase power device controlled by a plurality of pulse width modulation signals, the method comprising the steps of:
  monitoring a first time period and a second time period during a cycle, the cycle having a first voltage pulse train, a second voltage pulse train and a third voltage pulse train associated with each phase of the three-phase power device;
  determining whether the first time period and second time period are both less than a predetermined minimum window, if the first time period and second time period are both less than a predetermined minimum window then:
    shifting the first voltage pulse train during a second cycle to form a first sampling window;
    shifting the third voltage pulse train during the second cycle to form a second sampling window;
  determining whether the first time period is less than the predetermined minimum window and the second time period is greater than the predetermined minimum window, if the first time period is less than the predetermined minimum window and the second time period is greater than the predetermined minimum window then:
    determining whether more than one of the voltage pulse trains needs to be shifted to ensure the first sampling window is not less than the predetermined minimum window;
    if it is determined that not more than one of the voltage pulse trains needs to be shifted, then shifting the first voltage pulse train to form the first sampling window, the second sampling window being the same as the second time period;
    if it is determined that more than one of the voltage pulse trains needs to be shifted, then shifting the first and second voltage pulse trains to form the first and second modified sampling windows;
  sampling a first current during the first sampling window by the sensor;
  sampling a second current during the second sampling window by the sensor; and
  calculating a third current based on the sampling of the first and second currents.

20. The method of claim 19 wherein the method further includes the steps of:
  determining whether the first time period is greater than the predetermined minimum window and the second time period is less than the predetermined minimum window, if the first time period is greater than the predetermined minimum window and the second time period is less than the predetermined minimum window then:
    determining whether more than one of the voltage pulse trains needs to be shifted to ensure the second sampling window is not less than the predetermined minimum window;
    if it is determined that not more than one of the voltage pulse trains needs to be shifted, then shifting the third voltage pulse train to form the second sampling window, the first sampling window being the same as the first time period;
    if it is determined that more than one of the voltage pulse trains needs to be shifted, then shifting the third and the second voltage pulse trains to form the first and second sampling windows.

21. The method of claim 19 wherein the method further includes the step of determining whether a failure has occurred by sampling a fourth current by the sensor during a period when no current is expected to flow through the three-phase power device.

22. The method of claim 19 wherein the step of sampling the first current is done at about the middle of the first sampling window, and the step of sampling the second current is done at about the middle of the second sampling window.

23. The method of claim 19 wherein the steps of sampling the first and second currents are done using a counter, the counter ranging from a minimum value to a maximum value, the minimum value of the counter corresponding to the beginning and end of a cycle, the maximum value of the counter corresponding to the middle of the cycle.

24. The method of claim 19 wherein the steps of sampling of the first and second currents are done in a first cycle of a control loop period, the method further including the steps of:

sampling a fourth current during a second cycle of the control loop period;

sampling a fifth current during the second cycle of the control loop period;

averaging the fourth current and the first current to form an averaged first current; and averaging the fifth current and the second current to form an averaged second current;

wherein the step of calculating the third current is further based on the averaged first current and the averaged second current.

25. The method of claim 19 wherein the first voltage pulse train corresponds to the voltage pulse train associated with the highest output within the cycle, the second voltage pulse train corresponds to the voltage pulse train associated with the middle output within the cycle, and the third voltage pulse train corresponds to the voltage pulse train associated with the lowest output within the cycle.

26. The method of claim 19 wherein the method is carried out in a system having a plurality of control loop periods, each period having a plurality of pulse width modulation cycles.

27. The method of claim 26 wherein the cycle during which the step of monitoring the first and second time periods is carried out is within one control loop period, and the steps of shifting the voltage pulse trains is carried out in each of a plurality of cycles in another control loop period.

28. A method for measuring current in each phase of a three-phase power device by a sensor, the three-phase power device controlled by a plurality of pulse width modulation signals, the method comprising the steps of:

monitoring a first time period and a second time period during a cycle, the cycle having a first voltage pulse train, a second voltage pulse train and a third voltage pulse train associated with each phase of the three-phase power device;

determining whether the sum of the first time period and the second time period are less than a predetermined minimum overlap value, if the sum of the first time period and the second time period are less than the predetermined minimum overlap value then:

shifting the first voltage pulse train to form a set of first sampling windows;

shifting the third voltage pulse train to form a set of second sampling windows;

sampling a set of first currents during the set of first sampling windows by the sensor;

sampling a set of second currents during the set of second sampling windows by the sensor;

averaging the set of first currents to form an averaged first current;

averaging the set of second currents to form an averaged second current; and calculating a third current based on the averaged first current and the averaged second current.

29. The method of claim 28 wherein the method further includes the step of determining whether a failure has occurred by sampling a fourth current by the sensor during a period when no current is expected to flow through the three-phase power device.

30. The method of claim 28 wherein the step of sampling the set of first currents is done at about the middle of the first sampling windows, and the step of sampling the set of second currents is done at about the middle of the second sampling windows.

31. The method of claim 28 wherein the steps of sampling the sets of first and second currents are done using a counter, the counter ranging from a minimum value to a maximum value, the minimum value of the counter corresponding to the beginning and end of a cycle, the maximum value of the counter corresponding to the middle of the cycle.

32. The method of claim 28 wherein the steps of sampling of the sets of first and second currents are done in a first cycle of a control loop period, the method further including the steps of:

sampling a set of fourth currents during another cycle of the control loop period; and sampling a set of fifth currents during another cycle of the control loop period;

wherein the step of averaging the set of first currents to form the averaged first current includes averaging the set of fourth currents and the set of first currents to form the averaged first current;

wherein the step of averaging the set of second currents to form the averaged second current includes averaging the set of fifth currents and the set of second currents to form the averaged second current.

33. The method of claim 28 wherein the first voltage pulse train corresponds to the voltage pulse train associated with the highest output within the cycle, the second voltage pulse train corresponds to the voltage pulse train associated with the middle output within the cycle, and the third voltage pulse train corresponds to the voltage pulse train associated with the lowest output within the cycle.

34. The method of claim 28 wherein the method is carried out in a system having a plurality of control loop periods, each period having a plurality of pulse width modulation cycles.

35. The method of claim 34 wherein the cycle during which the step of monitoring the first and second time periods is carried out is within one control loop period, and the steps of shifting the first and third voltage pulse trains is carried out in each of a plurality of cycles in another control loop period.

36. A method for measuring current in each phase of a three-phase power device by a sensor, the three-phase power device controlled by a plurality of pulse width modulation signals, the method comprising the steps of:

monitoring a first time period and a second time period during a first cycle, the first cycle having a first voltage pulse train, a second voltage pulse train and a third voltage pulse train associated with each phase of the three-phase power device;

determining whether both the first time period and the second time period are less than a predetermined minimum window, if the first time period and second time period are both less than the predetermined minimum window then:

shifting the first voltage pulse train during a second and a third cycle to form a set of first sampling windows;

shifting the third voltage pulse train during the second cycle and the third cycle to form a set of second sampling windows;

sampling a set of first currents during the set of first sampling windows by the sensor;

sampling a set of second currents during the set of second sampling windows by the sensor;

averaging the set of first currents to form an averaged first current;

averaging the set of second currents to form an averaged second current; and calculating a third current based on the averaged first current and the averaged second current.

37. The method of claim 36 wherein the method further includes the step of determining whether a failure has occurred by sampling a fourth current by the sensor during a period when no cur-rent is expected to flow through the three-phase power device.

38. The method of claim 36 wherein the step of sampling the set of first currents is done at about the middle of the first sampling windows, and the step of sampling the set of second currents is done at about the middle of the second sampling windows.

39. The method of claim 36 wherein the steps of sampling the sets of first and second currents are done using a counter, the counter ranging from a minimum value to a maximum value, the minimum value of the counter corresponding to the beginning and end of a cycle, the maximum value of the counter corresponding to the middle of the cycle.

40. The method of claim 36 wherein the first voltage pulse train corresponds to the voltage pulse train associated with the highest output within the cycle, the second voltage pulse train corresponds to the voltage pulse train associated with the middle output within the cycle, and the third voltage pulse train corresponds to the voltage pulse train associated with the lowest output within the cycle.

41. The method of claim 36 wherein the method is carried out in a system having a plurality of control loop periods, each period having a plurality of pulse width modulation cycles.

42. The method of claim 41 wherein the cycle during which the step of monitoring the first and second time periods is carried out is within one control loop period, and the steps of shifting the first and third voltage pulse trains is carried out in each of a plurality of cycles in another control loop period.

43. A method for measuring current in each phase of a three-phase power device by a sensor, the three-phase power device controlled by a plurality of pulse width modulation signals, the method comprising the steps of:

monitoring a first time period and a second time period during a cycle, the cycle having a first voltage pulse train, a second voltage pulse train and a third voltage pulse train associated with each phase of the three-phase power device;

determining whether the first time period is less than a predetermined minimum window and whether the second time period is greater than a predetermined minimum window, if the first time period is less than a predetermined minimum window and the second time period is greater than a predetermined minimum window then:

determining whether more than one of the voltage pulse trains needs to be shifted to ensure that a first sampling window is not less than the predetermined minimum window;

if it is determined that not more than one of the voltage pulse trains needs to be shifted, then shifting the first voltage pulse train to form the first sampling window, a second sampling window being the same as the second time period;

if it is determined that more than one of the voltage pulse trains needs to be shifted, then shifting the first and second voltage pulse trains to form the first and second sampling windows;

sampling a first current during the first sampling window by the sensor;

sampling a second current during the second sampling window by the sensor; and calculating a third current based on the first current and the second current.

44. The method of claim 43 wherein the method further includes the step of determining whether a failure has occurred by sampling a fourth current by the sensor during a period when no current is expected to flow through the three-phase power device.

45. The method of claim 43 wherein the step of sampling the first current is done at about the middle of the first sampling window, and the step of sampling the second current is done at about the middle of the second sampling window.

46. The method of claim 43 wherein the steps of sampling the first and second currents are done using a counter, the counter ranging from a minimum value to a maximum value, the minimum value of the counter corresponding to the beginning and end of a cycle, the maximum value of the counter corresponding to the middle of the cycle.

47. The method of claim 43 wherein the steps of sampling of the first and second currents are done in a first cycle of a control loop period, the method further including the steps of:

sampling a fourth current during another cycle of the control loop period;

sampling a fifth current during another cycle of the control loop period;

averaging the fourth current and the first current to form an averaged first current; and averaging the fifth current and the second current to form an averaged second current;

wherein the step of calculating the third current is further based on the averaged first current and the averaged second current.

48. The method of claim 43 wherein the first voltage pulse train corresponds to the voltage pulse train associated with the highest output within the cycle, the second voltage pulse train corresponds to the voltage pulse train associated with the middle output within the cycle, and the third voltage pulse train corresponds to the voltage pulse train associated with the lowest output within the cycle.

49. The method of claim 43 wherein the steps of sampling the first and second currents is taken during a first half of a cycle, the method further including the steps of:

determining whether a fourth current and fifth current may be taken during a second half of the cycle, if the fourth current and fifth current may be taken during a second half of the cycle then:

sampling a fourth current during the second half of the cycle;

sampling a fifth current during the second half of the cycle;

averaging the fourth current and the second current to form an averaged second current; and averaging the third current and the fifth current to form an averaged third current.

50. The method of claim 43 wherein the method is carried out in a system having a plurality of control loop periods, each period having a plurality of pulse width modulation cycles.

51. The method of claim 50 wherein the cycle during which the step of monitoring the first and second time periods is carried out is within one control loop period, and the steps of shifting the first and third voltage pulse trains is carried out in each of a plurality of cycles in another control loop period.

52. A method for measuring current in each phase of a three-phase power device by a sensor, the three-phase power device controlled by a plurality of pulse width modulation signals, the method comprising the steps of:

monitoring a first time period and a second time period during a cycle, the cycle having a first voltage pulse train, a second voltage pulse train and a third voltage pulse train associated with each phase of the three-phase power device;

determining whether the first time period is greater than a predetermined minimum window and whether the second time period is less than a predetermined minimum window, if the first time period is greater than a predetermined minimum window and the second time period is less than a predetermined minimum window then:

determining whether more than one of the voltage pulse trains needs to be shifted to ensure that a second sampling window is not less than the predetermined minimum window;

if it is determined that not more than one of the voltage pulse trains needs to be shifted, then shifting the third voltage pulse train to form the second sampling window, the first sampling window being the same as the first time period;

if it is determined that more than one of the voltage pulse trains needs to be shifted, then shifting the third and second voltage pulse trains to form the first and second sampling windows;

sampling a first current during the first sampling window by the sensor;

sampling a second current during the second sampling window by the sensor; and calculating a third current based on the first current and the second current.

53. The method of claim 52 wherein the method further includes the step of determining whether a failure has occurred by sampling a fourth current by the sensor during a period when no current is expected to flow through the three-phase power device.

54. The method of claim 52 wherein the step of sampling the first current is done at about the middle of the first sampling window, and the step of sampling the second current is done at about the middle of the second sampling window.

55. The method of claim 52 wherein the steps of sampling the first and second currents are done using a counter, the counter ranging from a minimum value to a maximum value, the minimum value of the counter corresponding to the beginning and end of a cycle, the maximum value of the counter corresponding to the middle of the cycle.

56. The method of claim 52 wherein the steps of sampling of the first and second currents are done in a first cycle of a control loop period, the method further including the steps of:

sampling a fourth current during another cycle of the control loop period;

sampling a fifth current during another cycle of the control loop period;

averaging the fourth current and the first current to form an averaged first current; and averaging the fifth current and the second current to form an averaged second current;

wherein the step of calculating the third current is further based on the averaged first current and the averaged second current.

57. The method of claim 52 wherein the first voltage pulse train corresponds to the voltage pulse train associated with the highest output within the cycle, the second voltage pulse train corresponds to the voltage pulse train associated with the middle output within the cycle, and the third voltage pulse train corresponds to the voltage pulse train associated with the lowest output within the cycle.

58. The method of claim 52 wherein the steps of sampling the first and second currents is taken during a first half of a cycle, the method further including the steps of:

determining whether a fourth current and fifth current may be taken during a second half of the cycle, if the fourth current and fifth current may be taken during a second half of the cycle then:

sampling a fourth current during the second half of the cycle;

sampling a fifth current during the second half of the cycle;

averaging the fourth current and the third current to form an averaged third current; and averaging the fifth current and the first current to form an averaged first current.

59. The method of claim 52 wherein the method is carried out in a system having a plurality of control loop periods, each period having a plurality of pulse width modulation cycles.

60. The method of claim 59 wherein the cycle during which the step of monitoring the first and second time periods is carried out is within one control loop period, and the steps of shifting the first and third voltage pulse trains is carried out in each of a plurality of cycles in another control loop period.

* * * * *